US011643324B2

(12) United States Patent
Sakuragi

(10) Patent No.: US 11,643,324 B2
(45) Date of Patent: May 9, 2023

(54) MEMS SENSOR

(71) Applicant: ROHM CO., LTD., Kyoto (JP)

(72) Inventor: Masahiro Sakuragi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 225 days.

(21) Appl. No.: 16/984,999

(22) Filed: Aug. 4, 2020

(65) Prior Publication Data

US 2021/0039946 A1 Feb. 11, 2021

(30) Foreign Application Priority Data

Aug. 8, 2019 (JP) ............................. JP2019-146424

(51) Int. Cl.
*B81B 3/00* (2006.01)
*G01L 9/00* (2006.01)

(52) U.S. Cl.
CPC .......... *B81B 3/0021* (2013.01); *G01L 9/0042* (2013.01); *G01L 9/0054* (2013.01); *B81B 2201/0264* (2013.01); *B81B 2203/0127* (2013.01); *B81B 2203/0315* (2013.01)

(58) Field of Classification Search
USPC ....................................................... 257/419
IPC .............. G01L 9/0054,9/0042; B81C 1/00182, 2201/0195, 2201/017, 2203/036; B81B 3/0021, 2201/0264, 2203/0315, 2203/0127
See application file for complete search history.

(56) References Cited

U.S. PATENT DOCUMENTS

2019/0145842 A1\* 5/2019 Zhang ............... H01L 21/28167
257/417

FOREIGN PATENT DOCUMENTS

| CN | 1484319 A | \* | 3/2004 |
| JP | S5687372 A | | 7/1981 |
| JP | H09126922 A | | 5/1997 |
| JP | H1168118 A | | 3/1999 |
| JP | 2005065017 A | \* | 3/2005 |
| JP | 2009139338 A | \* | 6/2009 |
| JP | 2013229356 A | | 11/2013 |
| JP | 2016-017747 A | | 2/2016 |
| JP | 2016017747 A | \* | 2/2016 |

OTHER PUBLICATIONS

Notice of Reasons for Refusal dated Mar. 23, 2023, in the counterpart Japanese patent application No. 2019-146424.

\* cited by examiner

*Primary Examiner* — Hrayr A Sayadian
(74) *Attorney, Agent, or Firm* — Rabin & Berdo, P.C.

(57) ABSTRACT

A MEMS sensor includes a silicon substrate that has a first surface and a second surface on a side opposite to the first surface and that has a cavity in the first surface, a silicon diaphragm that has a first surface and a second surface on aside opposite to the first surface and in which the second surface is joined directly to the first surface of the silicon substrate, and a piezoresistance formed at the first surface of the silicon diaphragm, and, in the MEMS sensor, a plane orientation of the first surface of the silicon substrate and a plane orientation of the first surface of the silicon diaphragm differ from each other.

14 Claims, 31 Drawing Sheets

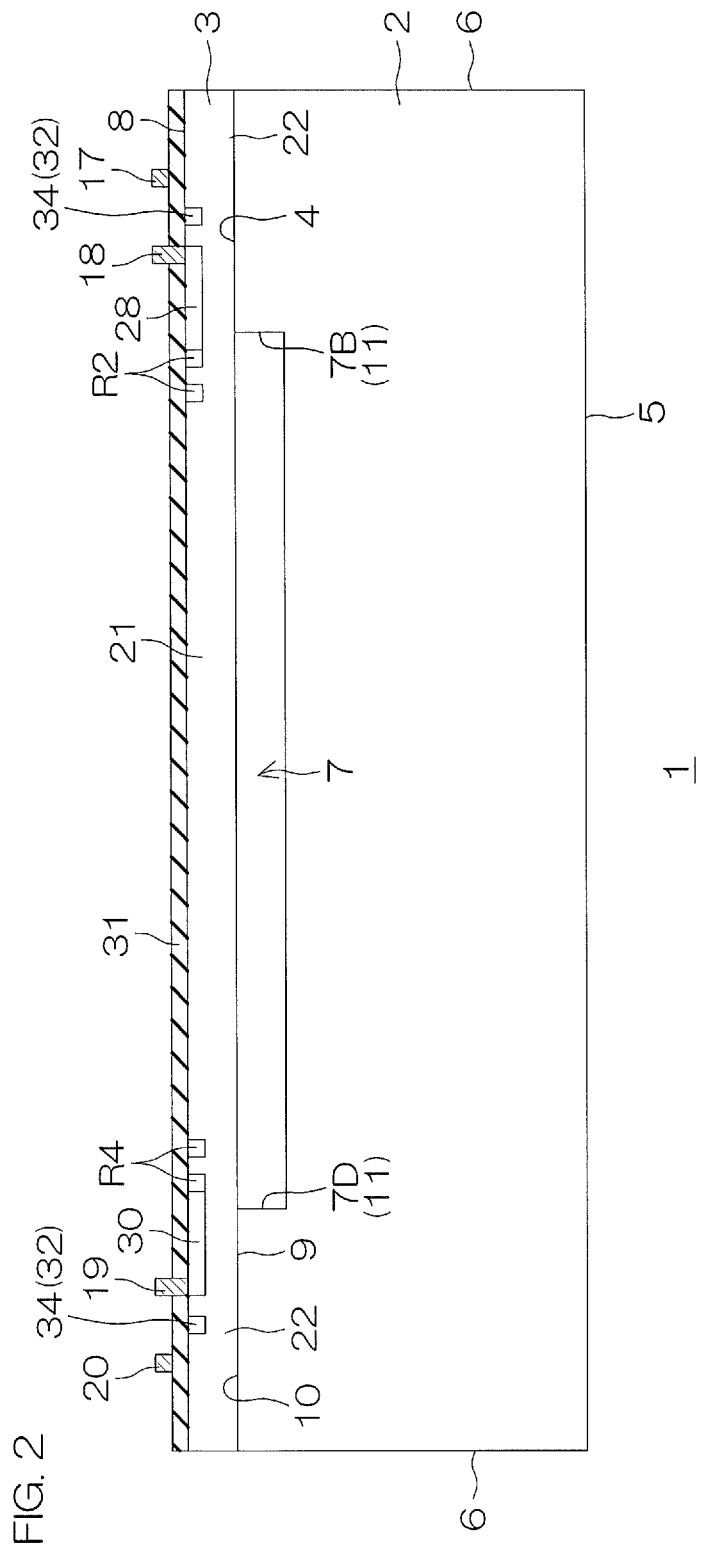

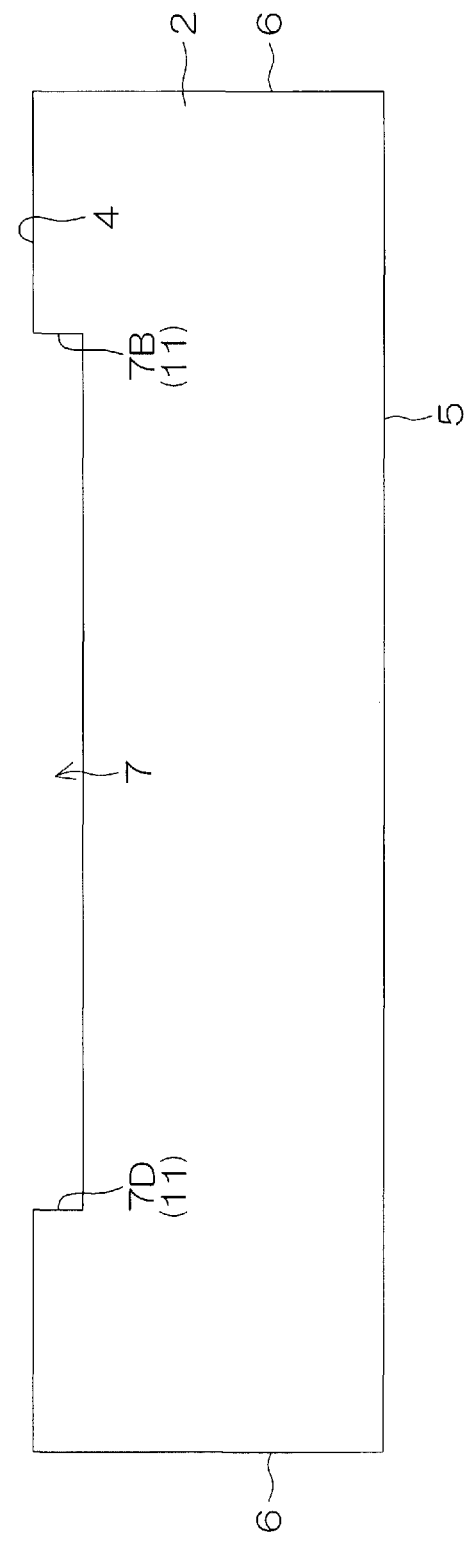

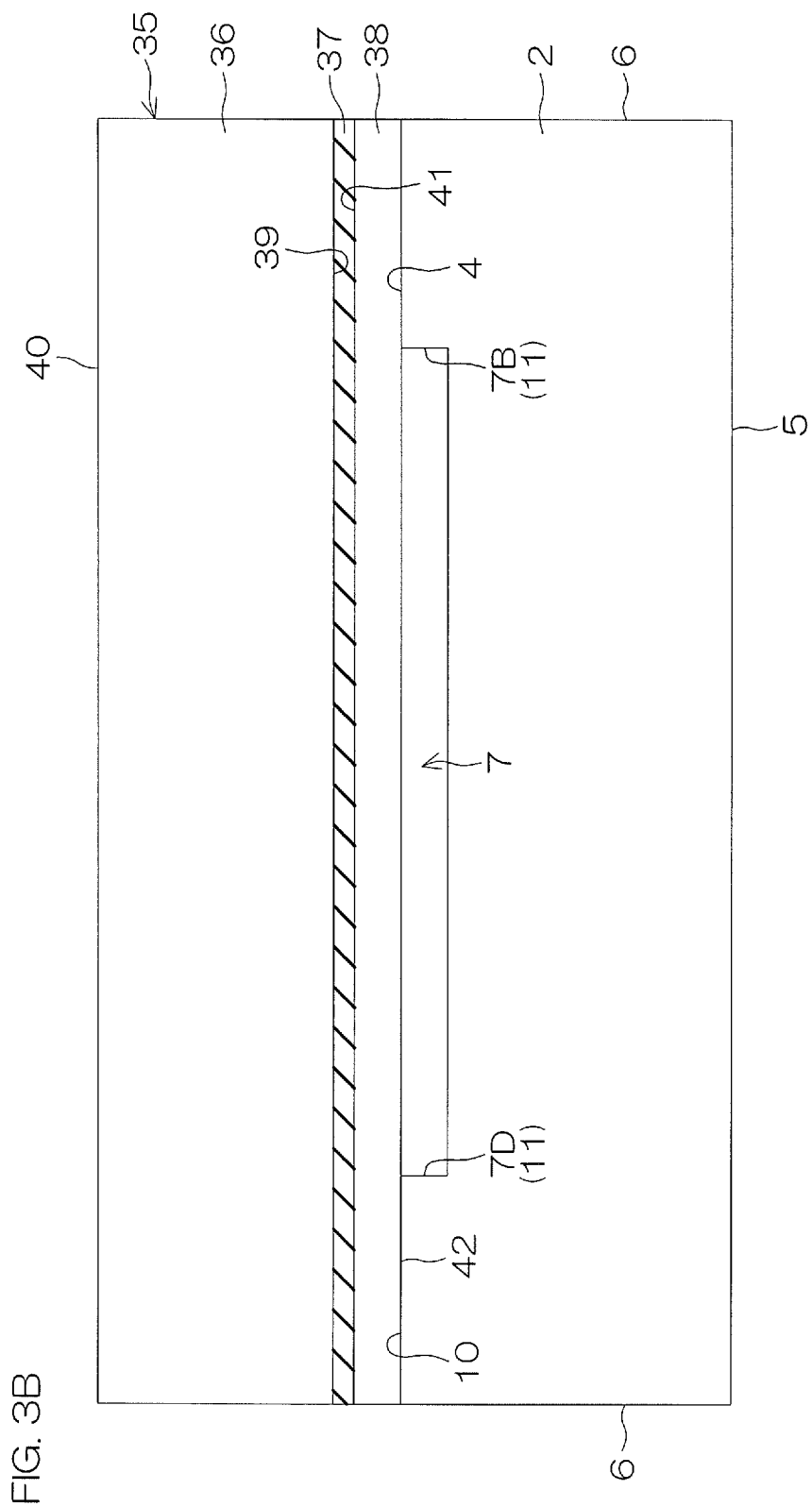

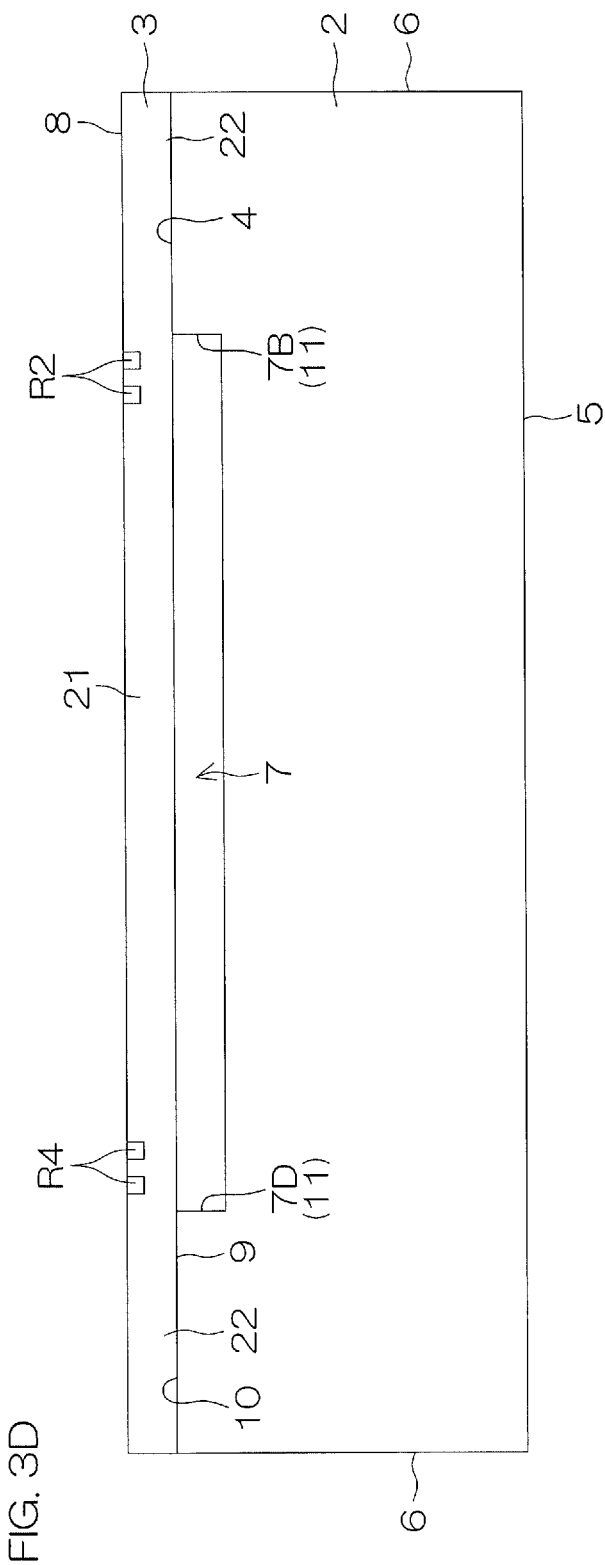

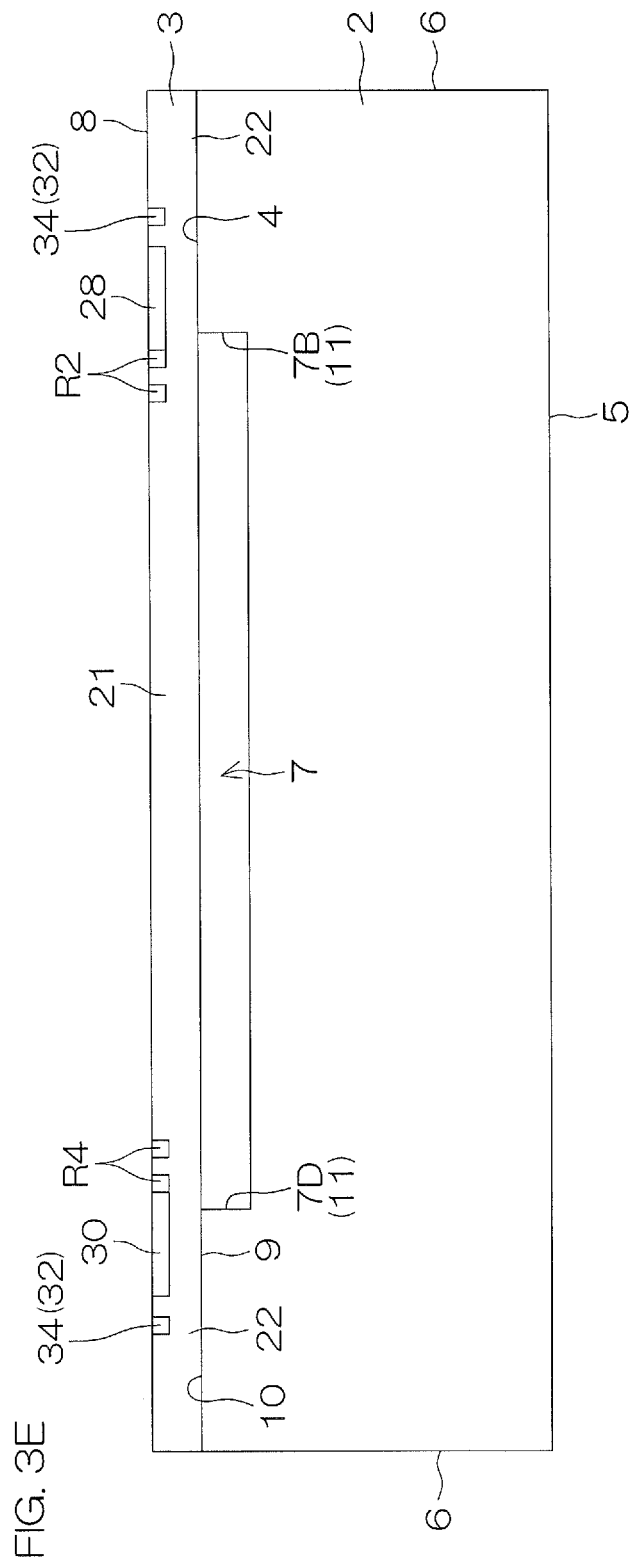

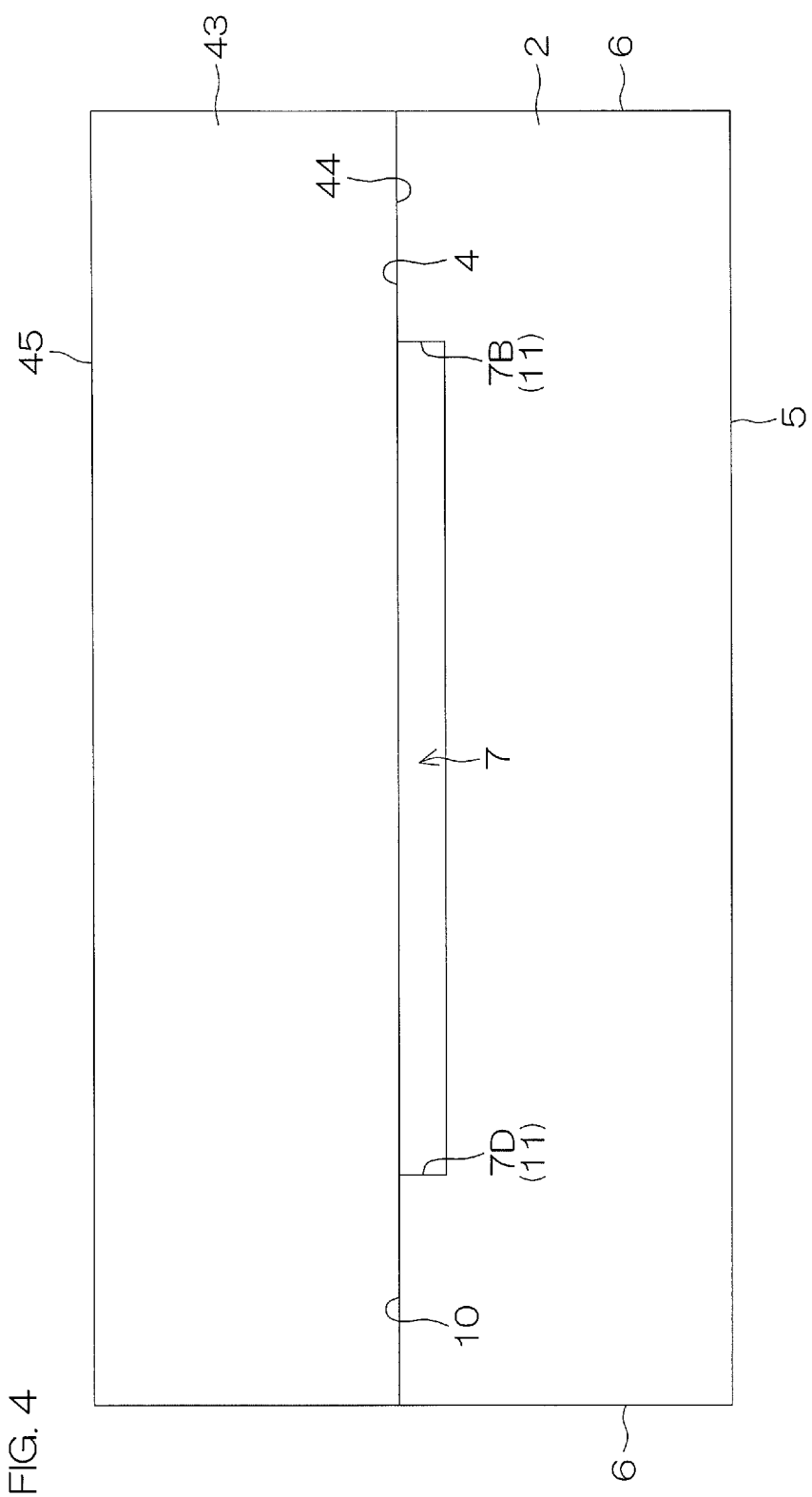

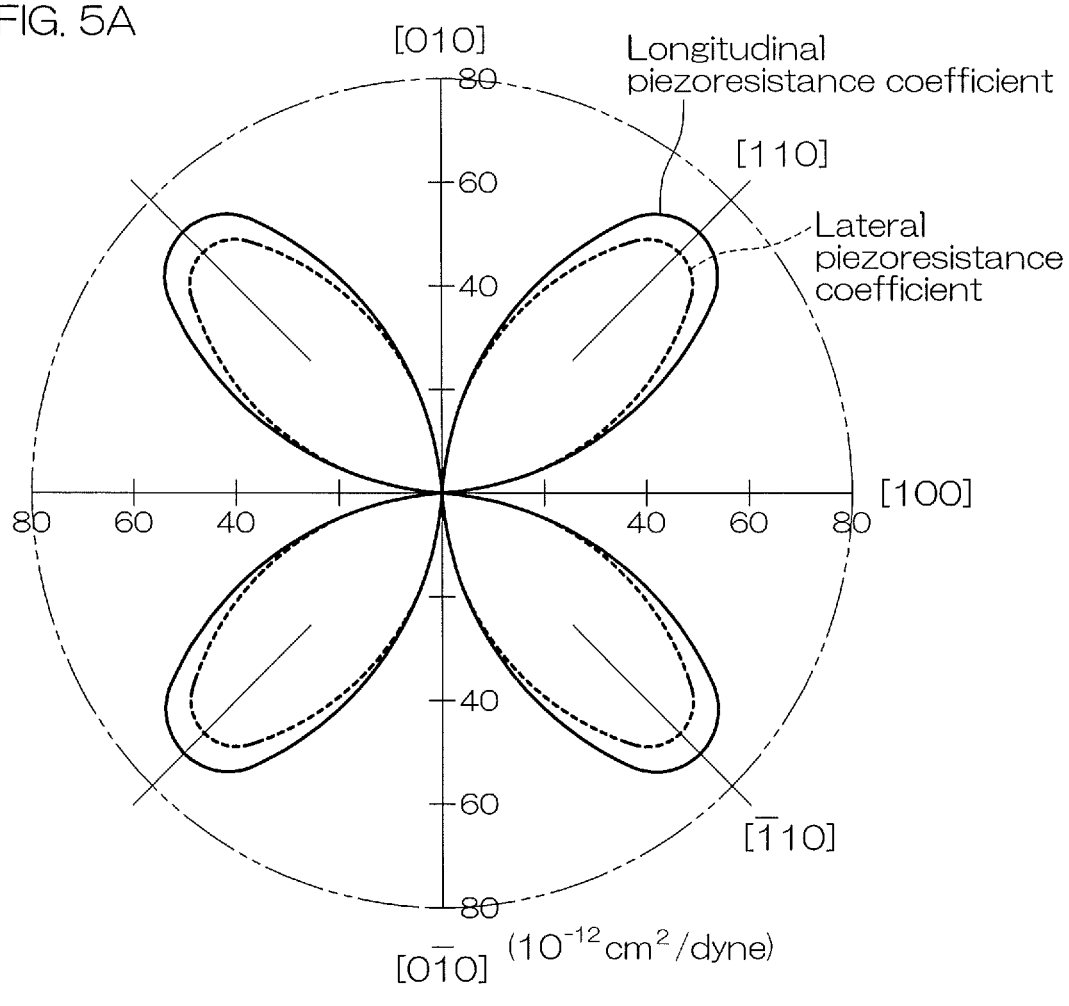

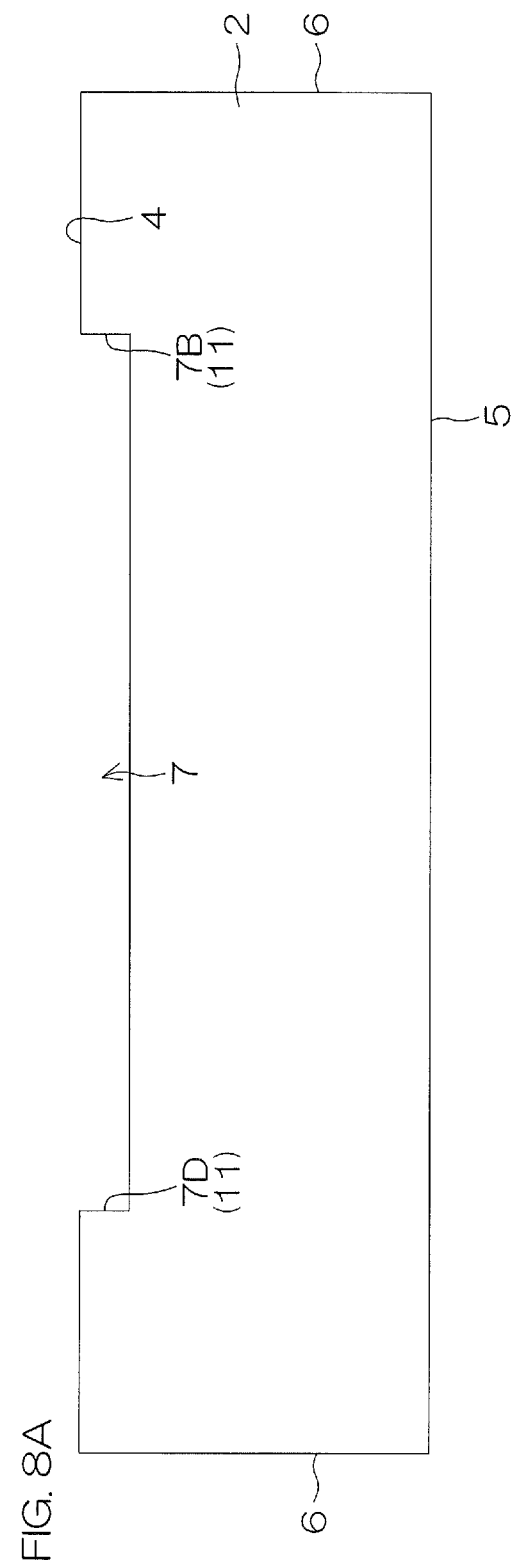

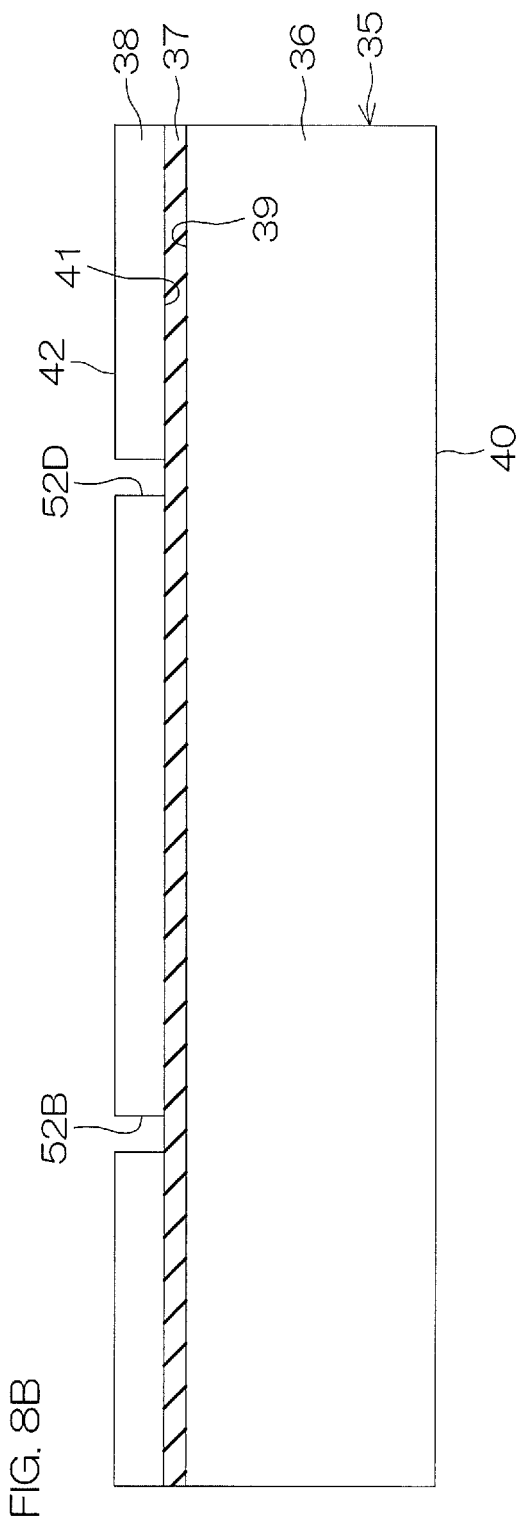

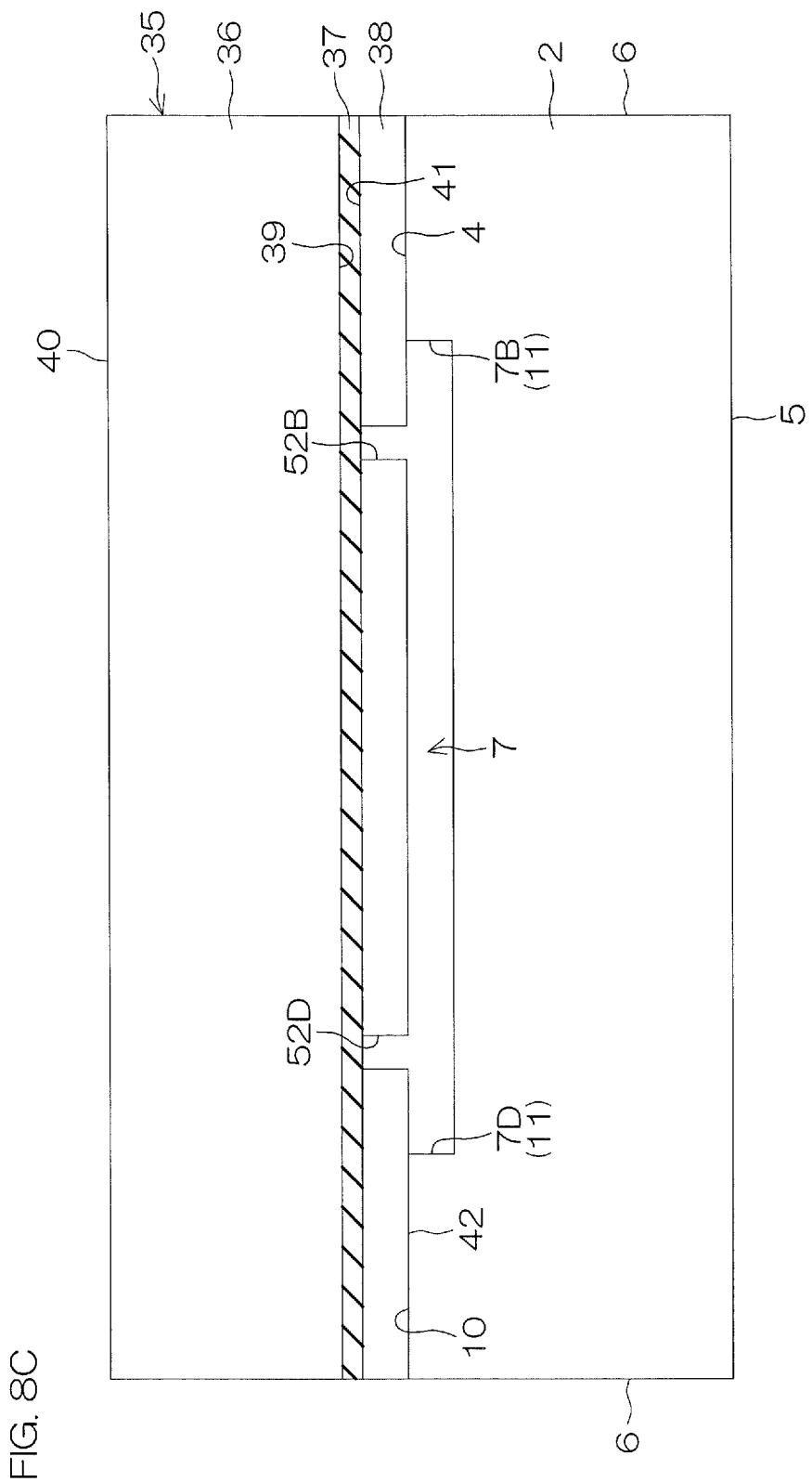

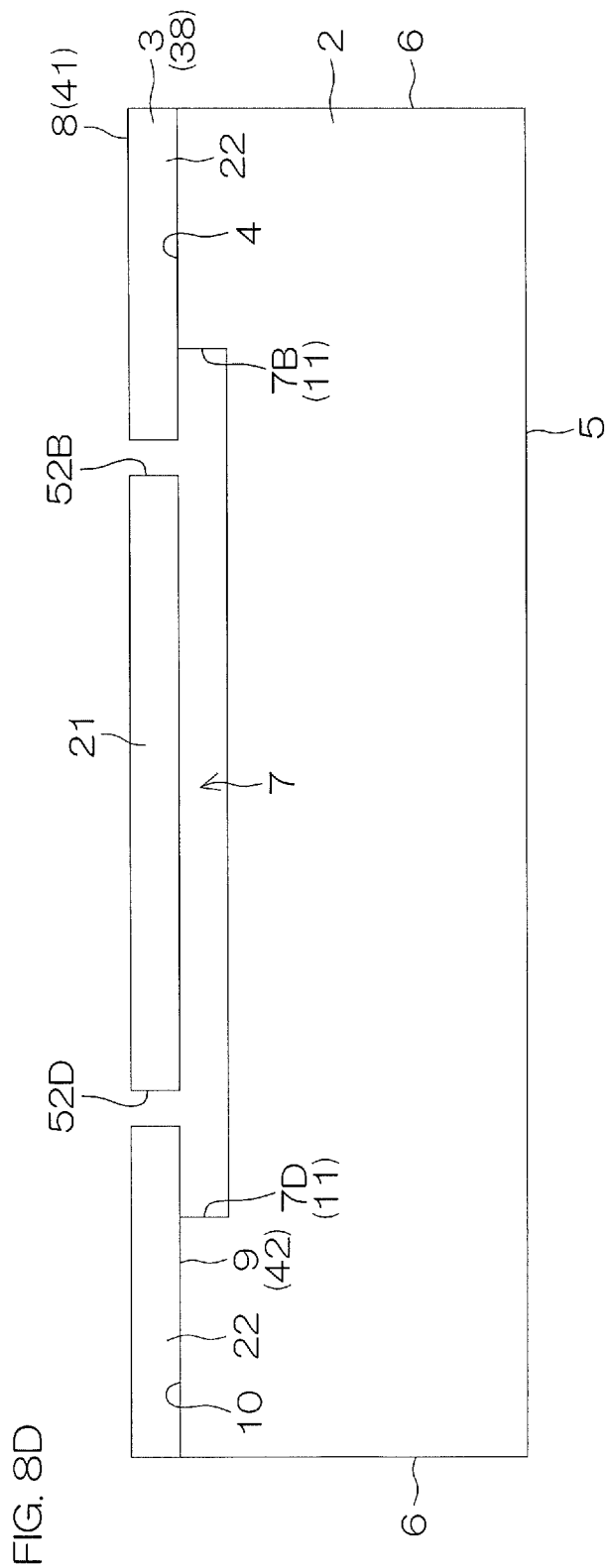

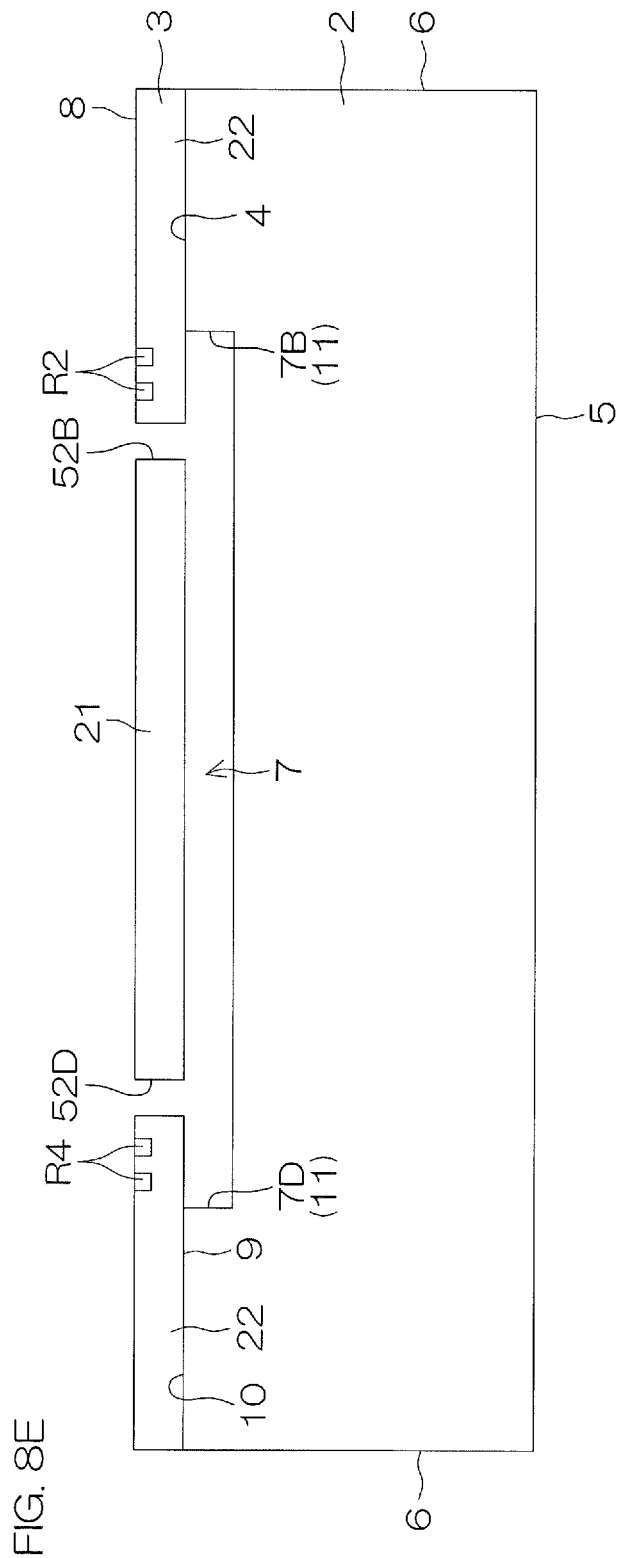

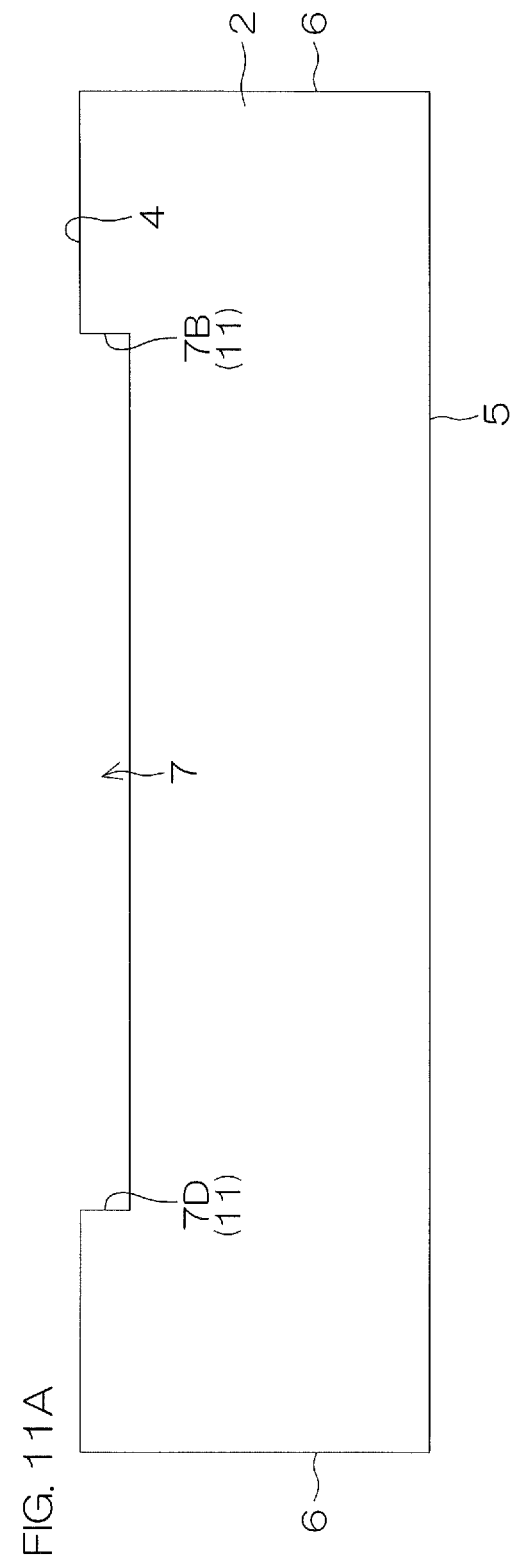

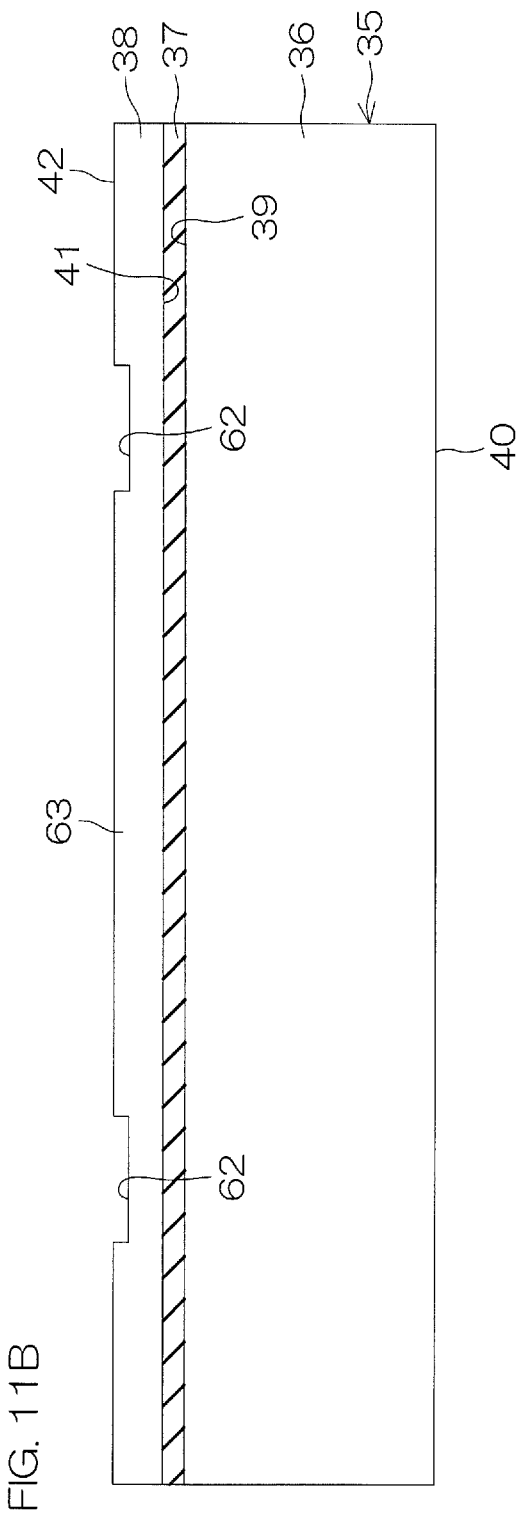

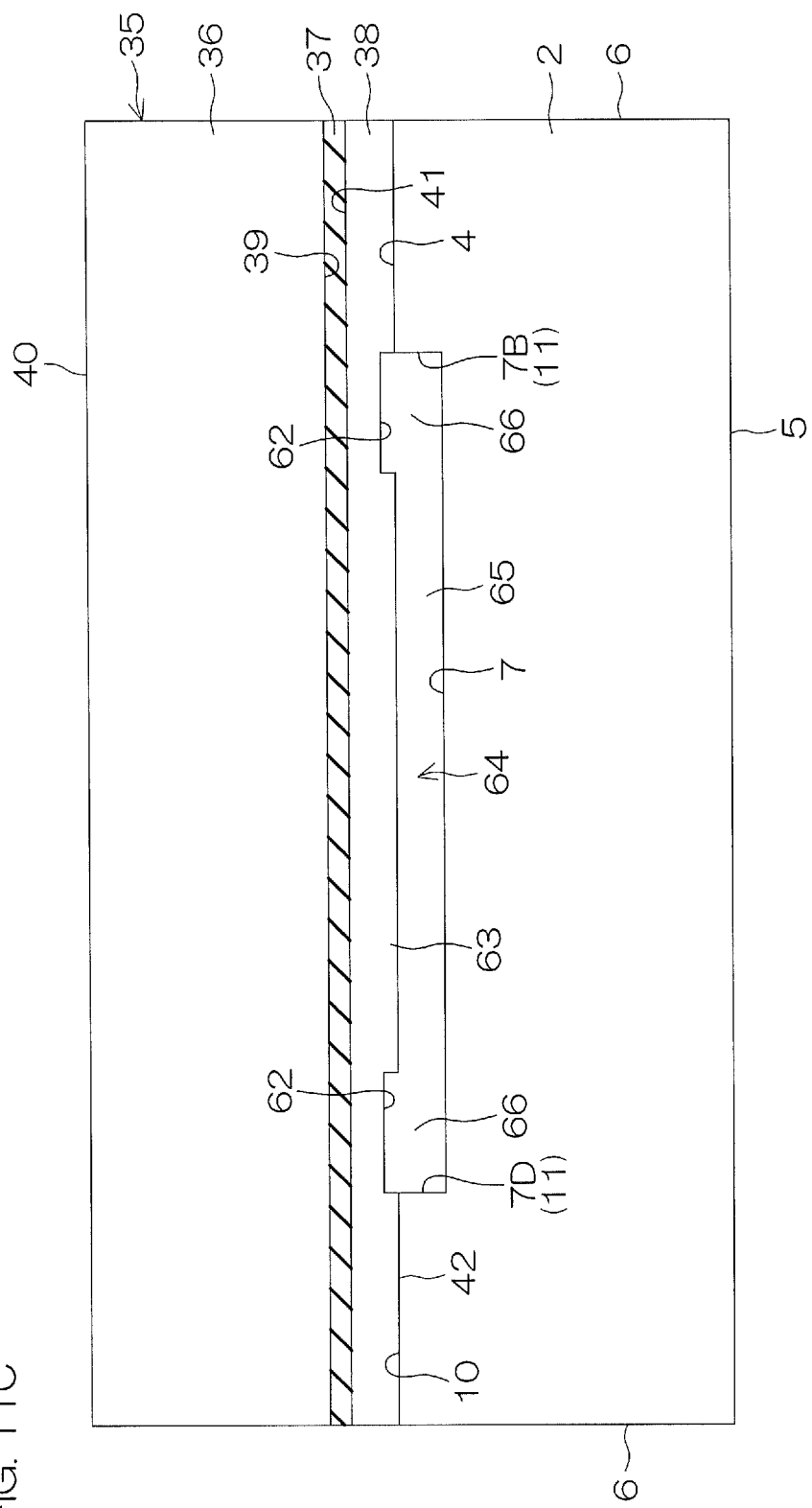

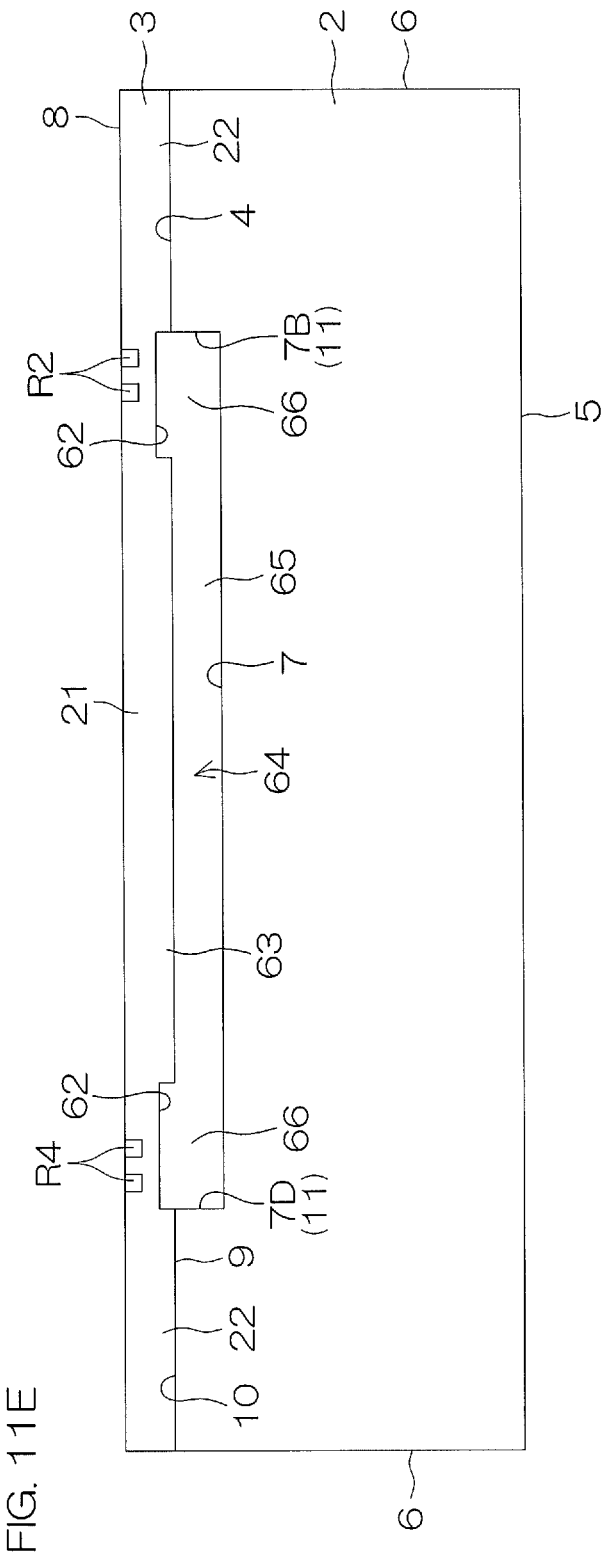

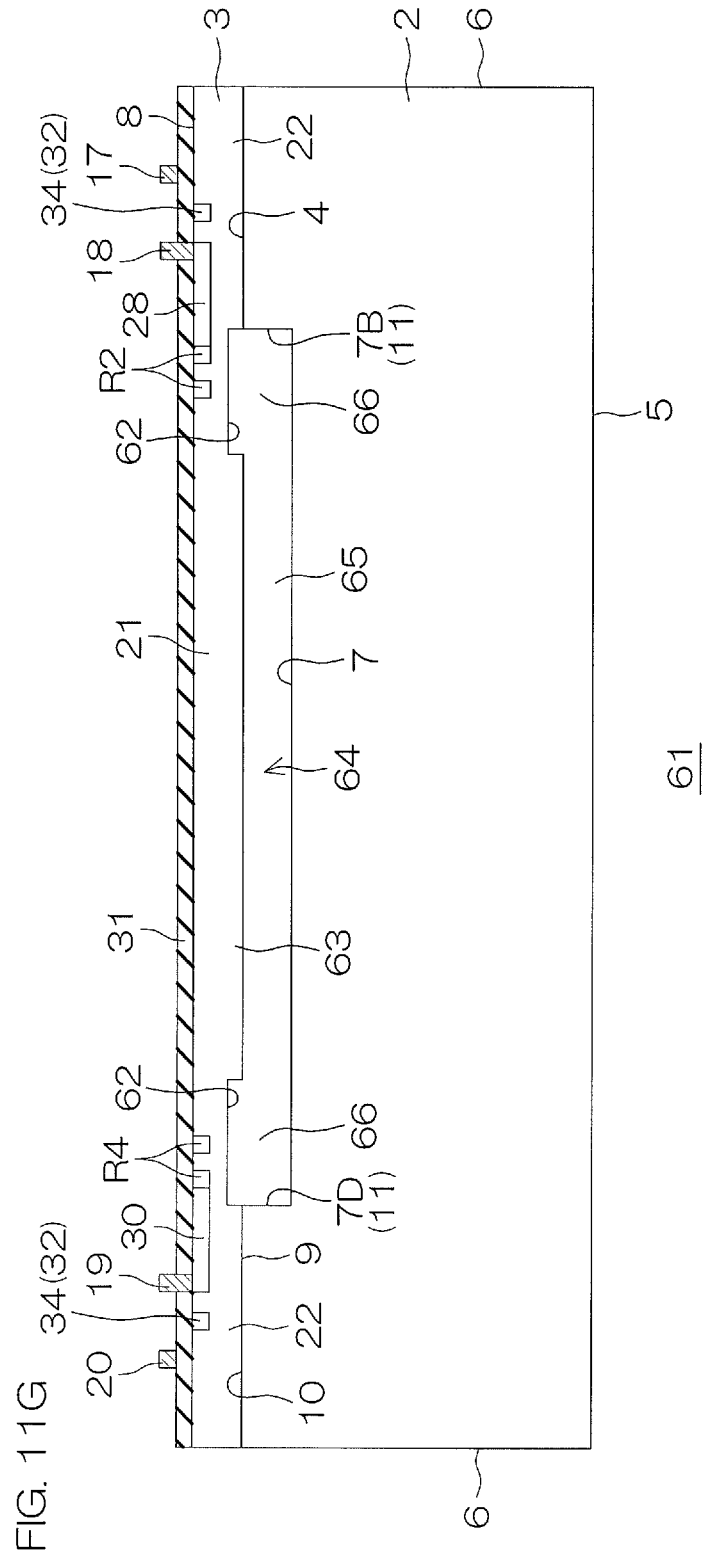

FIG. 12A [Structure 1]
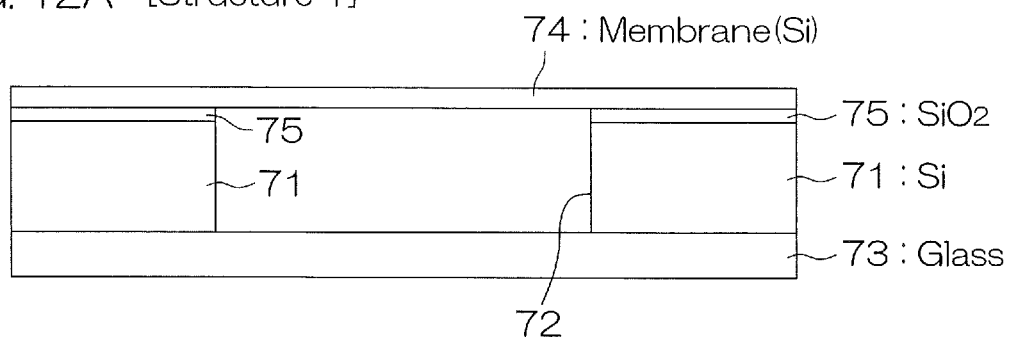
FIG. 12B [Structure 2]
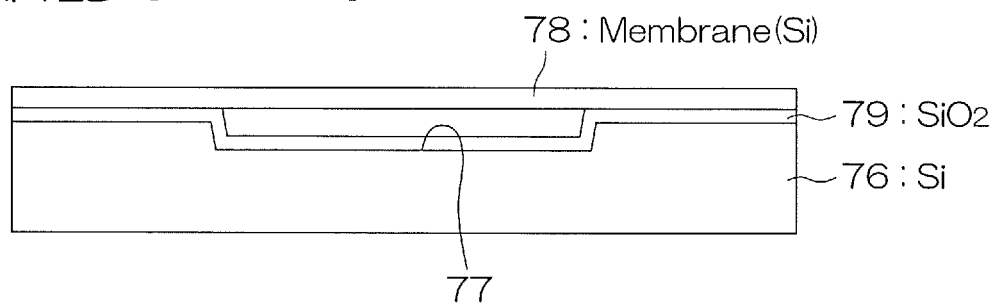
FIG. 12C [Structure 3]
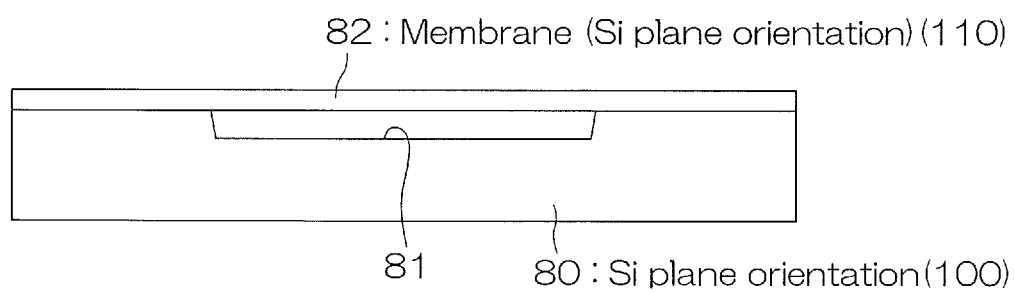

MEMS SENSOR

CROSS-REFERENCE TO RELATED APPLICATIONS

The present application corresponds to Japanese Patent Application No. 2019-146424 filed in the Japan Patent Office on Aug. 8, 2019, and the entire disclosure of the application is incorporated herein by reference.

TECHNICAL FIELD

The present invention relates to a MEMS sensor.

BACKGROUND ART

Patent Document 1 (Japanese Patent Application Publication No. 2016-17747) discloses a pressure sensor manufactured by a manufacturing method that has a step of preparing a SOI substrate in which a first silicon substrate and a second silicon substrate are stacked together with an oxide layer between the first and second silicon substrates and removing both the second silicon substrate and the oxide layer so that the first silicon substrate is exposed, a step of forming a diaphragm by forming a cavity in the first silicon substrate that has been exposed, and a step of sealing the cavity by joining a surface in which the cavity of the first silicon substrate is formed and a base substrate configured to have silicon together without interposing the oxide layer between the surface and the base substrate.

SUMMARY OF INVENTION

The present inventor has found that characteristics of a piezoresistance formed at a silicon diaphragm change depending on the plane orientation of silicon.

Therefore, an object of the present invention is to provide a MEMS sensor that is capable of raising characteristics of a piezoresistance to a higher grade than in the past.

A MEMS sensor according to an aspect of the present invention includes a silicon substrate that has a first surface and a second surface on a side opposite to the first surface and that has a cavity in the first surface, a silicon diaphragm that has a first surface and a second surface on aside opposite to the first surface and in which the second surface is joined directly to the first surface of the silicon substrate, and a piezoresistance formed at the first surface of the silicon diaphragm, and, in the MEMS sensor, a plane orientation of the first surface of the silicon substrate and a plane orientation of the first surface of the silicon diaphragm differ from each other.

EFFECTS OF INVENTION

According to the MEMS sensor according to one aspect of the present invention, the plane orientation of the first surface of the silicon substrate and the plane orientation of the first surface of the silicon diaphragm differ from each other. This makes it possible to employ a plane orientation in which characteristics of piezoresistances become optimal as the plane orientation of the first surface of the silicon diaphragm without being restricted by the plane orientation of the first surface of the silicon substrate.

Additionally, the cavity is formed not at the silicon diaphragm but at the silicon substrate that is thicker than the silicon diaphragm. Therefore, it is possible to form the cavity highly accurately and easily. Additionally, the MEMS sensor is formed by Si—Si direct junction between the silicon substrate and the silicon diaphragm. In other words, the substrate and the diaphragm are equal to each other in linear expansion coefficient, and therefore it is possible to restrain the occurrence of stress in the junction interface that results from a temperature change. Consequently, it is possible to stabilize characteristics of piezoresistances.

BRIEF DESCRIPTION OF DRAWINGS

FIG. 2 is a cross-sectional view of the MEMS sensor according to the first preferred embodiment of the present invention, showing a cross section along line II-II of FIG. 1.

FIG. 3A to FIG. 3F are views showing part of a process of manufacturing the MEMS sensor according to the first preferred embodiment of the present invention.

FIG. 4 is a view showing a modification of the step of FIG. 3B.

FIG. 5A is a view to describe the piezoresistance coefficient of a piezoresistance formed at a (100) surface.

FIG. 8A to FIG. 8G are views showing part of a process of manufacturing the MEMS sensor according to the second preferred embodiment of the present invention.

FIG. 11A to FIG. 11G are views showing part of a process of manufacturing the MEMS sensor according to the third preferred embodiment of the present invention.

FIG. 12A to FIG. 12C are views, respectively, showing structures 1 to 3 of MEMS sensors used in examples.

DESCRIPTION OF EMBODIMENTS

Figure 1:
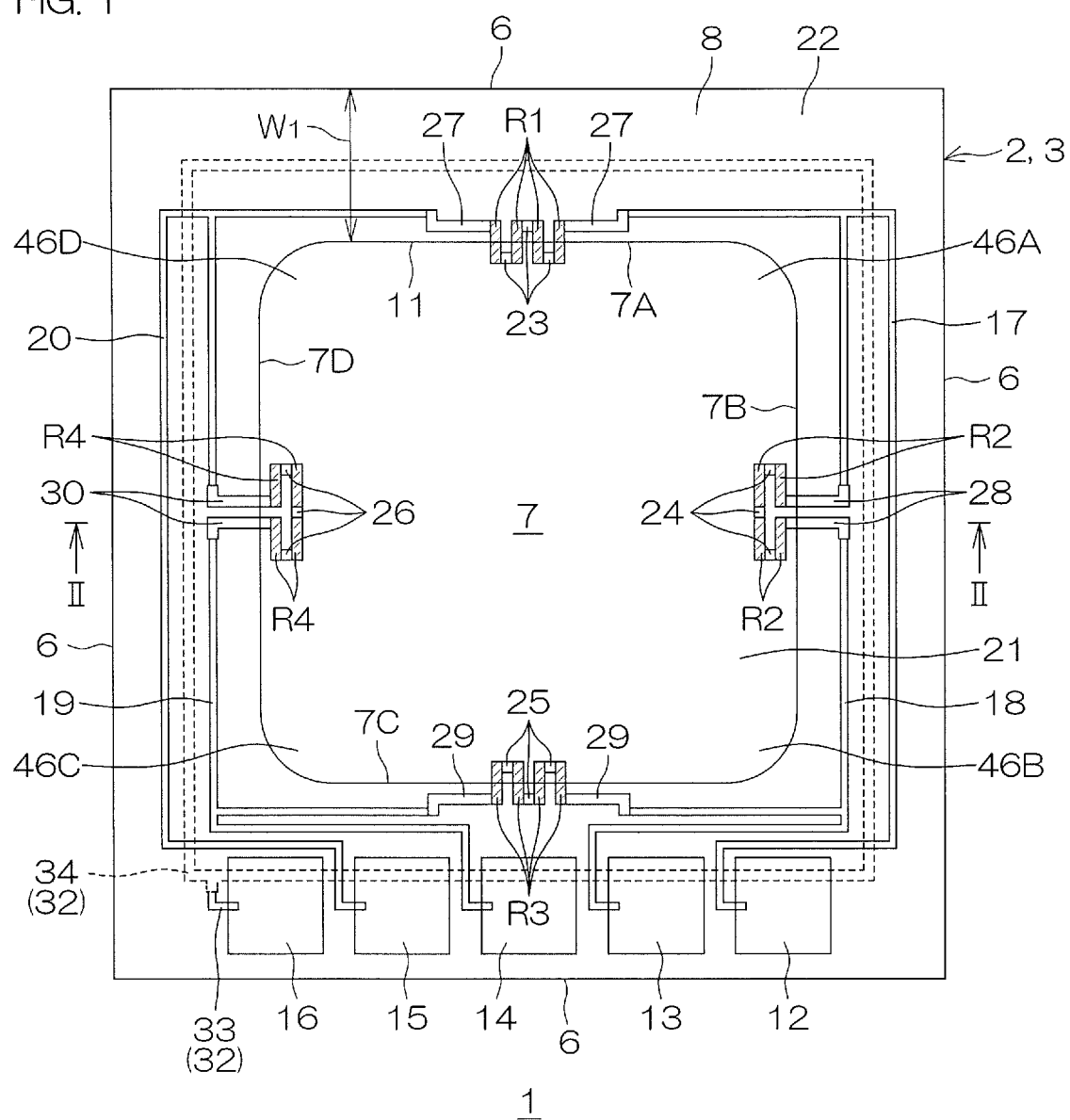
FIG. 1 is a plan view of a MEMS sensor according to a first preferred embodiment of the present invention.

First, an itemized description will be given of preferred embodiments of the present invention.

A MEMS sensor according to one preferred embodiment of the present invention includes a silicon substrate that has a first surface and a second surface on a side opposite to the first surface and that has a cavity in the first surface, a silicon diaphragm that has a first surface and a second surface on aside opposite to the first surface and in which the second surface is joined directly to the first surface of the silicon substrate, and a piezoresistance formed at the first surface of the silicon diaphragm, and, in the MEMS sensor, a plane orientation of the first surface of the silicon substrate and a plane orientation of the first surface of the silicon diaphragm differ from each other.

According to this arrangement, the plane orientation of the first surface of the silicon substrate and the plane orientation of the first surface of the silicon diaphragm differ from each other. This makes it possible to employ a plane orientation in which characteristics of the piezoresistance become optimal as the plane orientation of the first surface of the silicon diaphragm without being restricted by the plane orientation of the first surface of the silicon substrate.

Additionally, the cavity is formed not at the silicon diaphragm but at the silicon substrate that is thicker than the silicon diaphragm. Therefore, it is possible to form the cavity highly accurately and easily. Additionally, the MEMS sensor is formed by Si—Si direct junction between the silicon substrate and the silicon diaphragm. In other words, the substrate and the diaphragm are equal to each other in linear expansion coefficient, and therefore it is possible to restrain the occurrence of stress in the junction interface that results from a temperature change. Consequently, it is possible to stabilize characteristics of the piezoresistance.

In the MEMS sensor according to one preferred embodiment of the present invention, the plane orientation of the first surface of the silicon substrate may be a (100) surface, and the plane orientation of the first surface of the silicon diaphragm is a (110) surface.

In the MEMS sensor according to one preferred embodiment of the present invention, the piezoresistance may be formed in a longitudinal shape that extends in a direction of a <111> axis.

According to this arrangement, the plane orientation of the first surface of the silicon diaphragm is a (100) surface, and the piezoresistance is formed in a longitudinal shape that extends in a direction of a <111> axis. Hence, it is possible to enlarge the longitudinal piezoresistance coefficient of the piezoresistance, and therefore it is possible to improve the sensibility of the piezoresistance.

In the MEMS sensor according to one preferred embodiment of the present invention, the cavity may be formed in a quadrangular shape in a plan view, and the piezoresistance may include a plurality of piezoresistances disposed at each side of the cavity in a plan view, and the plurality of piezoresistances may be each formed in a longitudinal shape that extends in the direction of the <111> axis.

According to this arrangement, the plane orientation of the first surface of the silicon substrate is a (100) surface, and each of the piezoresistances is formed in a longitudinal shape that extends in the direction of the <111> axis. Hence, it is possible to enlarge the longitudinal piezoresistance coefficient of the piezoresistance, and therefore it is possible to improve the sensibility of the piezoresistance.

Additionally, the piezoresistance is disposed at each side of the cavity. Hence, when the silicon diaphragm vibrates, the piezoresistances disposed at a pair of first and third sides facing each other of the cavity are pulled in the longitudinal direction, and resistance increases. On the other hand, the piezoresistances disposed at a pair of second and fourth sides facing each other of the cavity are pulled in the width direction, and resistance decreases. As a result, it is possible to make a large difference in the resistance value between the piezoresistances of the first and third sides and the piezoresistances of the second and fourth sides.

In the MEMS sensor according to one preferred embodiment of the present invention, the plurality of piezoresistances may include a first piezoresistance, a second piezoresistance, a third piezoresistance, and a fourth piezoresistance, and the MEMS sensor may include a wiring that is electrically connected to the first to fourth piezoresistances and that forms a bridge circuit including the first to fourth piezoresistances.

In the MEMS sensor according to one preferred embodiment of the present invention, the silicon diaphragm may have a predetermined thickness.

In the MEMS sensor according to one preferred embodiment of the present invention, the silicon diaphragm may have a thickness of 3 μm to 30 μm.

In the MEMS sensor according to one preferred embodiment of the present invention, the cavity may be sealed with the silicon diaphragm.

According to this arrangement, the MEMS sensor is formed by Si—Si direct junction between the silicon substrate and the silicon diaphragm, and therefore an oxide film is not formed therebetween. As a result, it is possible to prevent a gas from entering the cavity through the oxide film even when the MEMS sensor is used in a gaseous environment in which the radius of an atom, such as helium (He) or hydrogen ($H_2$), is small. As a result, it is possible to hold the degree of vacuum of the inside of the cavity, and therefore it is possible to prevent the property fluctuation of the MEMS sensor.

In the MEMS sensor according to one preferred embodiment of the present invention, the silicon diaphragm may have a through-hole that leads to the cavity.

In the MEMS sensor according to one preferred embodiment of the present invention, the cavity may be formed in a quadrangular shape in a plan view, and the silicon diaphragm may have a plurality of through-holes that lead to the cavity. Each of the plurality of through-holes may be formed at each corner portion of the cavity in a plan view.

In the MEMS sensor according to one preferred embodiment of the present invention, the silicon diaphragm may have a second cavity that faces the cavity. The second cavity may be formed at the second surface of the silicon diaphragm.

In the MEMS sensor according to one preferred embodiment of the present invention, the second cavity may be formed annularly along a circumferential edge of the cavity in a plan view.

In the MEMS sensor according to one preferred embodiment of the present invention, the cavity may be sealed with the silicon diaphragm.

According to this arrangement, the MEMS sensor is formed by Si—Si direct junction between the silicon substrate and the silicon diaphragm, and therefore an oxide film is not formed therebetween. As a result, it is possible to prevent a gas from entering the cavity through the oxide film even when the MEMS sensor is used in a gaseous environment in which the radius of an atom, such as helium (He) or hydrogen ($H_2$), is small. As a result, it is possible to hold the degree of vacuum of the inside of the cavity, and therefore it is possible to prevent the property fluctuation of the MEMS sensor.

In the MEMS sensor according to one preferred embodiment of the present invention, a width of a junction interface between the silicon substrate and the silicon diaphragm that is defined by a distance from the circumferential edge of the cavity to an end surface of the silicon substrate in a plan view may be 50 μm to 500 μm.

Detailed Description of Preferred Embodiments of the Present Invention

Next, preferred embodiments of the present invention will be described in detail with reference to the accompanying drawings.

FIG. 1 is a plan view of a MEMS sensor 1 according to a first preferred embodiment of the present invention. FIG. 2 is a cross-sectional view of the MEMS sensor 1 according to the first preferred embodiment of the present invention, showing a cross section along line II-II of FIG. 1.

The MEMS sensor 1 is applicable to various sensors, such as an atmospheric pressure sensor or a pressure sensor. The MEMS sensor 1 includes a silicon substrate 2 and a silicon diaphragm 3.

The silicon substrate 2 has a first surface 4 and a second surface 5 on the side opposite to the first surface 4. The first surface 4 and the second surface 5 of the silicon substrate 2 may be referred to as a front surface and a rear surface of the silicon substrate 2, respectively. The silicon substrate 2 additionally has an end surface 6. In the present preferred embodiment, the silicon substrate 2 is formed in a quadrangular shape in a plan view, and the end surface 6 includes four end surfaces 6 that form four sides of the silicon substrate 2 in a plan view. The end surface 6 of the silicon substrate 2 may be referred to as a lateral surface of the silicon substrate 2 or as a third surface.

In the present preferred embodiment, the first surface 4 of the silicon substrate 2 is a (100) surface, and the second surface 5 is a (100) surface, and the end surface 6 is a (110) surface.

The thickness of the silicon substrate 2 is, for example, 100 μm to 775 μm. The silicon substrate 2 has a cavity 7 formed in the first surface 4. The depth of the cavity 7 is, for example, 5 μm to 20 μm. The cavity 7 is formed in a substantially quadrangular shape in a plan view as shown in FIG. 1. More specifically, the cavity 7 is formed in a quadrangular shape that has four corner portions a corner of each of which has been rounded off in a plan view, i.e., the cavity 7 is formed in a quadrangular shape that has a first corner portion 46A, a second corner portion 46B, a third corner portion 46C, and a fourth corner portion 46D. Therefore, the cavity 7 has a first side 7A, a second side 7B, a third side 7C, and a fourth side 7D in a plan view.

The silicon diaphragm 3 is made of a silicon material thinner than the silicon substrate 2, and has a first surface 8 and a second surface 9 on the side opposite to the first surface 8. The first surface 8 and the second surface 9 of the silicon diaphragm 3 may be referred to as a front surface and a rear surface of the silicon diaphragm 3, respectively. In the present preferred embodiment, the first surface 8 of the silicon diaphragm 3 is a (110) surface, and the second surface 9 is a (110) surface. The silicon diaphragm 3 has a predetermined thickness. The thickness of the silicon diaphragm 3 is, for example, 3 μm to 30 μm. Additionally, the silicon diaphragm 3 is membranous, and hence may be referred to as a silicon membrane.

The silicon diaphragm 3 is joined directly to the silicon substrate 2. More specifically, the second surface 9 of the silicon diaphragm 3 is joined directly to the first surface 4 of the silicon substrate 2. Hence, a junction interface 10 of Si—Si junction is formed between the silicon substrate 2 and the silicon diaphragm 3.

The junction interface 10 is formed in a closed-annular shape that surrounds the cavity 7 in the present preferred embodiment, and hence the cavity 7 is sealed by the silicon diaphragm 3. The width $W_1$ of the junction interface 10 is, for example, 50 μm to 500 μm in a plan view. The width $W_1$ of the junction interface 10 may be defined by a distance from a circumferential edge 11 (first to fourth sides 7A to 7D) of the cavity 7 to the end surface 6 of the silicon substrate 2.

The MEMS sensor 1 additionally includes piezoresistances R1 to R4 serving as strain gauges, metallic terminals 12 to 16, and metallic wirings 17 to 20.

The piezoresistances R1 to R4 are diffusion resistances formed on the first surface 8 of the silicon diaphragm 3 by introducing impurities, such as boron (B), into the silicon diaphragm 3, and may be referred to as "gauges," respectively. In the present preferred embodiment, the silicon diaphragm 3 includes a movable portion 21 that moves in response to pressure fluctuations of the cavity 7 while facing the cavity 7 and a fixed portion 22 joined to the silicon substrate 2.

The piezoresistances R1 to R4 are disposed with substantially equal intervals between the piezoresistances R1 to R4 along a circumferential direction of the movable portion 21 formed in a substantially quadrangular shape in a plan view. More specifically, the first piezoresistance R1 is disposed at the first side 7A of the cavity 7, and the second piezoresistance R2 is disposed at the second side 7B of the cavity 7, and the third piezoresistance R3 is disposed at the third side 7C of the cavity 7, and the fourth piezoresistance R4 is disposed at the fourth side 7D of the cavity 7 in a plan view.

The first piezoresistance R1 and the third piezoresistance R3 that face each other with the center of the movable portion 21 between the first and third piezoresistances R1 and R3 are each formed in a longitudinal shape extending in a mutually-facing direction of the first and third piezoresistances R1 and R3 (i.e., direction that crosses the first side 7A and the third side 7C of the cavity 7). The first piezoresistance R1 and the third piezoresistance R3 straddle between the movable portion 21 and the fixed portion 22 in a plan view. In other words, the first piezoresistance R1 and the third piezoresistance R3 straddle between the inside and the outside of the cavity 7 in a plan view.

The number of first piezoresistances R1 and the number of third piezoresistances R3 formed in the present preferred embodiment are four and four, respectively. The four first piezoresistances R1 are arranged with intervals between the first piezoresistances R1 along a boundary portion between the movable portion 21 and the fixed portion 22 (i.e., along the circumferential edge 11 of the cavity 7). A first relay wiring 23 is formed between mutually-adjoining first piezoresistances R1.

The first relay wiring 23 connects the four first piezoresistances R1 together in series. The first relay wiring 23 is connected to one end portion in a longitudinal direction of each of the first piezoresistances R1, and some of the first relay wirings 23 (in the present preferred embodiment, two) are formed at the movable portion 21 of the silicon diaphragm 3, and the remaining first relay wirings 23 are formed at the fixed portion 22 of the silicon diaphragm 3. The first relay wiring 23 is a diffusion wiring ($p^+$ type region) formed at the first surface 8 of the silicon diaphragm 3 by introducing impurities, such as boron (B), into the silicon diaphragm 3 with a high concentration.

Likewise, the four third piezoresistances R3 are arranged with intervals between the third piezoresistances R3 along the boundary portion between the movable portion 21 and the fixed portion 22 (i.e., along the circumferential edge 11 of the cavity 7). A third relay wiring 25 is formed between mutually-adjoining third piezoresistances R3. The third relay wiring 25 connects the four third piezoresistances R3 together in series.

The third relay wiring 25 is connected to one end portion in a longitudinal direction of each of the third piezoresistances R3, and some of the third relay wirings 25 (in the present preferred embodiment, two) are formed at the movable portion 21 of the silicon diaphragm 3, and the remaining third relay wirings 25 are formed at the fixed portion 22 of the silicon diaphragm 3. The third relay wiring 25 is a diffusion wiring ($p^+$ type region) formed at the first surface

8 of the silicon diaphragm 3 by introducing impurities, such as boron (B), into the silicon diaphragm 3 with a high concentration.

On the other hand, the second piezoresistance R2 and the fourth piezoresistance R4 that face each other with the center of the movable portion 21 between the second and fourth piezoresistances R2 and R4 are each formed in a longitudinal shape extending in a direction perpendicular to a mutually-facing direction of the second and fourth piezoresistances R2 and R4 (i.e., direction along the second side 7B and the fourth side 7D of the cavity 7). The second piezoresistance R2 and the fourth piezoresistance R4 are housed inside the movable portion 21 in a plan view.

The number of second piezoresistances R2 and the number of fourth piezoresistances R4 formed in the present preferred embodiment are four and four, respectively. The four second piezoresistances R2 are arranged with intervals between the second piezoresistances R2 in a 2×2 matrix manner. A second relay wiring 24 is formed between mutually-adjoining second piezoresistances R2.

The second relay wiring 24 connects the four second piezoresistances R2 together in series. The second relay wiring 24 is connected to one end portion in a longitudinal direction of each of the second piezoresistances R2, and all of the second relay wirings 24 (in the present preferred embodiment, three) are formed at the movable portion 21 of the silicon diaphragm 3. The second relay wiring 24 is a diffusion wiring ($p^+$ type region) formed at the first surface 8 of the silicon diaphragm 3 by introducing impurities, such as boron (B), into the silicon diaphragm 3 with a high concentration.

Likewise, the four fourth piezoresistances R4 are arranged with intervals between the fourth piezoresistances R4 in a 2×2 matrix manner. A fourth relay wiring 26 is formed between mutually-adjoining fourth piezoresistances R4. The fourth relay wiring 26 connects the four fourth piezoresistances R4 together in series.

The fourth relay wiring 26 is connected to one end portion in a longitudinal direction of each of the fourth piezoresistances R4, and all of the fourth relay wirings 26 (in the present preferred embodiment, three) are formed at the movable portion 21 of the silicon diaphragm 3. The fourth relay wiring 26 is a diffusion wiring ($p^+$ type region) formed at the first surface 8 of the silicon diaphragm 3 by introducing impurities, such as boron (B), into the silicon diaphragm 3 with a high concentration.

A first contact wiring 27 is connected to each end portion in the longitudinal direction of a pair of first piezoresistances R1, which are outer ones, of the four first piezoresistances R1. A pair of first contact wirings 27 are connected to the first piezoresistance R1 in the fixed portion 22, and extend in mutually-opposite directions along the boundary portion between the movable portion 21 and the fixed portion 22 (i.e., along the circumferential edge 11 of the cavity 7). The first contact wiring 27 is a diffusion wiring ($p^+$ type region) formed at the first surface 8 of the silicon diaphragm 3 by introducing impurities, such as boron (B), into the silicon diaphragm 3 with a high concentration.

Likewise, a third contact wiring 29 is connected to each end portion in the longitudinal direction of a pair of third piezoresistances R3, which are outer ones, of the four third piezoresistances R3. A pair of third contact wirings 29 are connected to the third piezoresistance R3 in the fixed portion 22, and extend in mutually-opposite directions along the boundary portion between the movable portion 21 and the fixed portion 22 (i.e., along the circumferential edge 11 of the cavity 7). The third contact wiring 29 is a diffusion wiring (p+ type region) formed at the first surface 8 of the silicon diaphragm 3 by introducing impurities, such as boron (B), into the silicon diaphragm 3 with a high concentration.

A second contact wiring 28 is connected to each end portion in the longitudinal direction of a pair of second piezoresistances R2, which are closer to the boundary portion (the circumferential edge 11 of the cavity 7) between the movable portion 21 and the fixed portion 22, of the four second piezoresistances R2. The pair of second contact wirings 28 are connected to the second piezoresistance R2 in the movable portion 21, and extend in the same direction while crossing the boundary portion (the circumferential edge 11 of the cavity 7) between the movable portion 21 and the fixed portion 22. The second contact wiring 28 is a diffusion wiring ($p^+$ type region) formed at the first surface 8 of the silicon diaphragm 3 by introducing impurities, such as boron (B), into the silicon diaphragm 3 with a high concentration.

A fourth contact wiring 30 is connected to each end portion in the longitudinal direction of a pair of fourth piezoresistances R4, which are closer to the boundary portion (the circumferential edge 11 of the cavity 7) between the movable portion 21 and the fixed portion 22, of the four fourth piezoresistances R4. The pair of fourth contact wirings 30 are connected to the fourth piezoresistance R4 in the movable portion 21, and extend in the same direction while crossing the boundary portion (the circumferential edge 11 of the cavity 7) between the movable portion 21 and the fixed portion 22. The fourth contact wiring 30 is a diffusion wiring ($p^+$ type region) formed at the first surface 8 of the silicon diaphragm 3 by introducing impurities, such as boron (B), into the silicon diaphragm 3 with a high concentration.

Referring to FIG. 2, an insulating layer 31 is formed on the first surface 8 of the silicon diaphragm 3. The insulating layer 31 may be made of, for example, silicon oxide ($SiO_2$) or silicon nitride (SiN). The insulating layer 31 covers the movable portion 21 and the fixed portion 22 of the silicon diaphragm 3. The thickness of the insulating layer 31 may be, for example, 0.1 μm to 2.0 μm.

The metallic terminals 12 to 16 include a first metallic terminal 12, a second metallic terminal 13, a third metallic terminal 14, a fourth metallic terminal 15, and a fifth metallic terminal 16. The first to fifth metallic terminals 12 to 16 are formed on the insulating layer 31. The first to fifth metallic terminals 12 to 16 are arranged with intervals between the first to fifth metallic terminals 12 to 16 along one end surface 6 of the silicon substrate 2 in a plan view. The first to fifth metallic terminals 12 to 16 are each made of aluminum (Al) in the present preferred embodiment. The first to fourth metallic terminals 12 to 15 may be referred to as an earth terminal (GND), an negative-side voltage output terminal (Vout−), a voltage application terminal (Vdd), and a positive-side voltage output terminal (Vout+) in accordance with objects to which these metallic terminals 12 to 15 are respectively connected. The fifth metallic terminal 16 is a terminal of the substrate, and is set to become an electric potential greater than the voltage application terminal (Vdd).

The first to fourth metallic wirings 17 to 20 are wirings to form a bridge circuit (Wheatstone bridge) by means of a bridge connection of the piezoresistances R1 to R4.

Specifically, the first metallic wiring 17 connects the first piezoresistance R1 and the second piezoresistance R2 together at the fixed portion 22, and is connected to the first metallic terminal 12. The second metallic wiring 18 connects the second piezoresistance R2 and the third piezoresistance R3 together at the fixed portion 22, and is connected to the second metallic terminal 13. The third metallic wiring 19 connects the third piezoresistance R3 and the fourth piezoresistance R4 together at the fixed portion 22, and is connected to the third metallic terminal 14. The fourth metallic wiring 20 connects the fourth piezoresistance R4 and the first piezoresistance R1 together at the fixed portion 22, and is connected to the fourth metallic terminal 15.

The first to fourth metallic wirings 17 to 20 are each made of aluminum (Al) in the present preferred embodiment, and are formed on the insulating layer 31. The first metallic wiring 17 is connected to the first and second contact wirings 27 and 28 through the insulating layer 31, and the second metallic wiring 18 is connected to the second and third contact wirings 28 and 29 through the insulating layer 31 (see FIG. 2). The third metallic wiring 19 is connected to the third and fourth contact wirings 29 and 30 through the insulating layer 31 (see FIG. 2), and the fourth metallic wiring 20 is connected to the fourth and first contact wirings 30 and 27 through the insulating layer 31.

A fifth wiring 32 is connected to the fifth metallic terminal 16. The fifth wiring 32 includes a metallic wiring 33 formed on the insulating layer 31 and a diffusion wiring 34 formed on the first surface 8 of the silicon diaphragm 3. Referring to FIG. 2, the diffusion wiring 34 is formed in an annular shape surrounding the cavity 7 in a plan view. The diffusion wiring 34 may pass through a space below the first to fifth metallic terminals 12 to 16. In other words, the diffusion wiring 34 may overlap with at least one of the first to fifth metallic terminals 12 to 16 in a plan view.

A passivation film (not shown) with which the first to fourth metallic wirings 17 to 20 and the first to fifth metallic terminals 12 to 16 are covered may be formed on the insulating layer 31.

FIG. 3A to FIG. 3F are views showing part of a process of manufacturing the MEMS sensor 1 according to the first preferred embodiment of the present invention. FIG. 4 is a view showing a modification of a step of FIG. 3B.

In order to manufacture the MEMS sensor 1, the silicon substrate 2 is prepared, and the cavity 7 is formed in the silicon substrate 2, for example, as shown in FIG. 3A. The cavity 7 may be formed by selectively applying dry etching to the first surface 4 of the silicon substrate 2.

Thereafter, a SOI substrate 35 is prepared as shown in FIG. 3B. The SOI substrate 35 includes a support substrate 36 made of silicon, a BOX (Buried Oxide) layer 37 on the support substrate 36, and an active layer 38 made of silicon on the BOX layer 37. For example, the thickness of the support substrate 36 may be 625 µm to 775 µm, and the thickness of the BOX layer 37 may be 0.5 µm to 2.0 µm, and the thickness of the active layer 38 may be 3 µm to 30 µm.

The support substrate 36 has a first surface 39 contiguous to the BOX layer 37 and a second surface 40 on the side opposite to the first surface 39. In the present preferred embodiment, the first surface 39 of the support substrate 36 is a (100) surface, and the second surface 40 is a (100) surface. The active layer 38 has a first surface 41 contiguous to the BOX layer 37 and a second surface 42 on the side opposite to the first surface 41. In the present preferred embodiment, the first surface 41 of the active layer 38 is a (110) surface, and the second surface 42 is a (110) surface.

Thereafter, the SOI substrate 35 is reversed up and down, and the SOI substrate 35 is bonded onto the silicon substrate 2 so that the second surface 42 of the active layer 38 comes into contact with the first surface 4 of the silicon substrate 2. Thereafter, annealing treatment is performed, for example, at 1000° C. to 1200° C. for 30 minutes to 90 minutes. Hence, the SOI substrate 35 is joined to the silicon substrate 2.

The substrate to be joined to the silicon substrate 2 may be the second silicon substrate 43 as shown in FIG. 4. For example, the thickness of the second silicon substrate 43 may be 625 µm to 775 µm. The second silicon substrate 43 has a first surface 44 and a second surface 45 on the side opposite to the first surface 44. In the present preferred embodiment, the first surface 44 of the second silicon substrate 43 is a (110) surface, and the second surface 45 is a (110) surface. In this case, the following way is recommended, i.e., the second silicon substrate 43 is reversed up and down, and the second silicon substrate 43 is bonded onto the silicon substrate 2 so that the first surface 44 of the second silicon substrate 43 comes into contact with the first surface 4 of the silicon substrate 2, and the second silicon substrate 43 and the silicon substrate 2 are joined together.

In other words, it is recommended to bond the SOI substrate 35 or the second silicon substrate 43 to the silicon substrate 2 so that the (110) surface of the active layer 38 or of the second silicon substrate 43 is directed upwardly both in FIG. 3B and in FIG. 4.

Figure 3C:
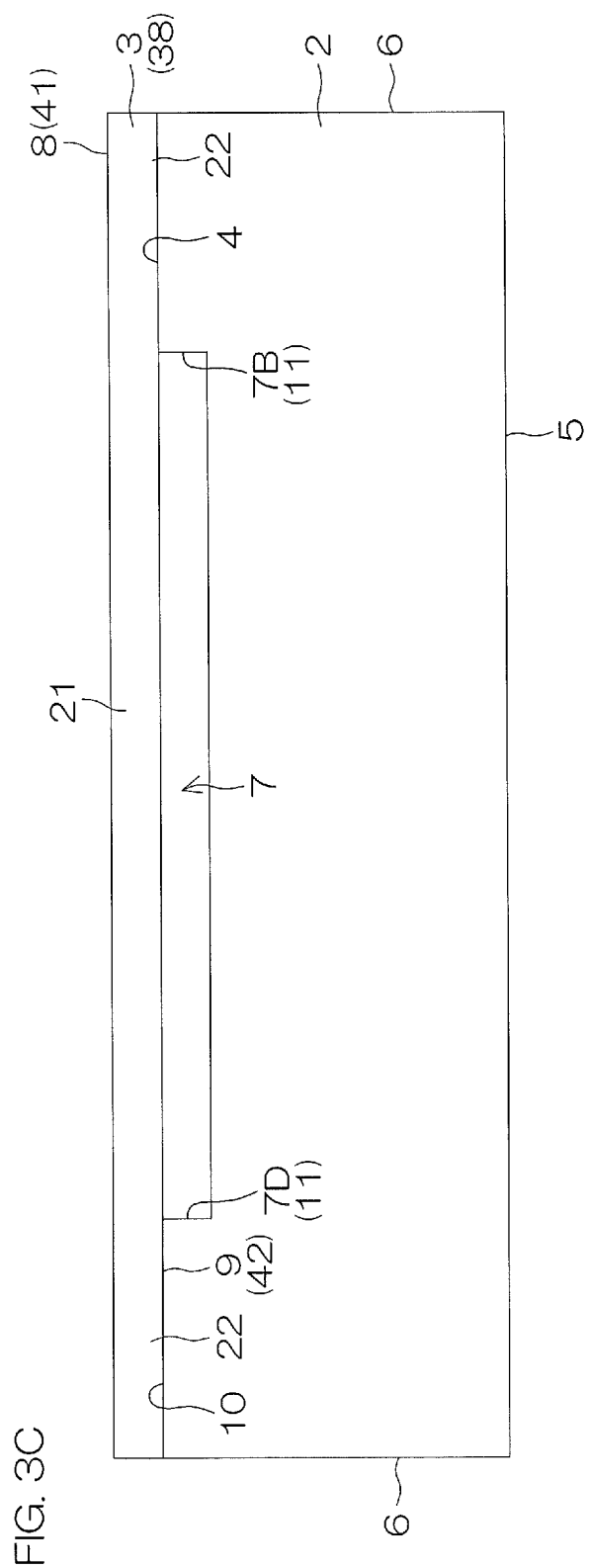

Thereafter, the support substrate 36 and the BOX layer 37 of the SOI substrate 35 are removed as shown in FIG. 3C. The support substrate 36 and the BOX layer 37 can be removed by, for example, grinding, etching, or the like. Thereafter, the active layer 38 is processed until the active layer 38 attains a desired thickness (thickness of the silicon diaphragm 3). The active layer 38 may be thinned by, for example, grinding, etching, polishing, or the like. If the active layer 38 is pre-formed with a desired thickness at the stage of the SOI substrate 35, the step of thinning the active layer 38 can be omitted after the BOX layer 37 is removed. Hence, the silicon diaphragm 3 made of the active layer 38 is formed.

On the other hand, if the second silicon substrate 43 is used instead of the SOI substrate 35, it is recommended to thin the second silicon substrate 43 up to a desired thickness by grinding, etching, polishing, or the like.

Thereafter, impurity ions (in the present preferred embodiment, boron (B)) are selectively implanted into the first surface 8 of the silicon diaphragm 3 as shown in FIG. 3D, and annealing treatment is performed. Hence, the piezoresistances R1 to R4 are formed at the silicon diaphragm 3.

Thereafter, impurity ions (in the present preferred embodiment, boron (B)) are selectively implanted into the first surface 8 of the silicon diaphragm 3 as shown in FIG. 3E, and annealing treatment is performed. Hence, the piezoresistances R1 to R4 are formed at the silicon diaphragm 3. The first to fourth relay wirings 23 to 26, the first to fourth contact wirings 27 to 30, and the diffusion wiring 34 of the fifth wiring 32 are formed.

Figure 3F:
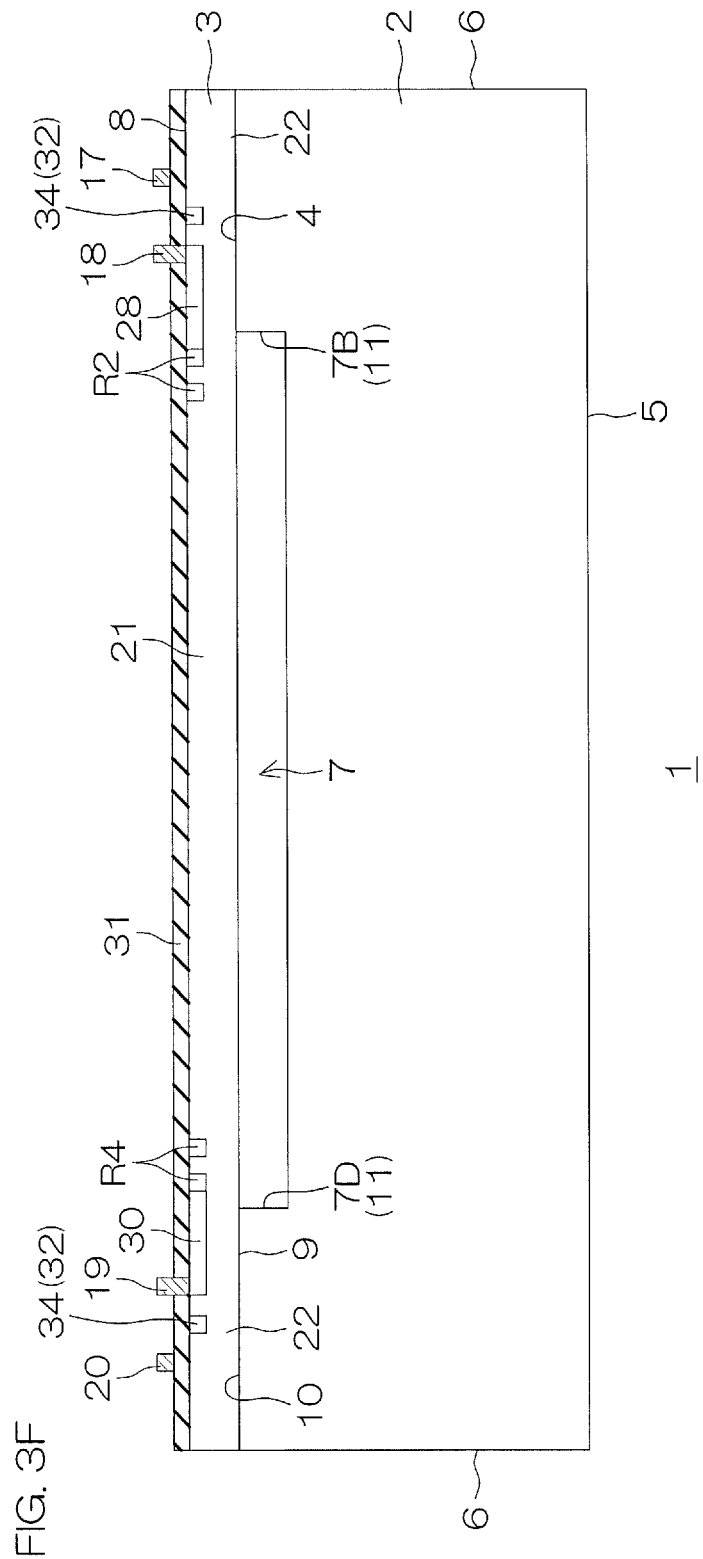

Thereafter, the insulating layer 31 is formed on the silicon diaphragm 3 by, for example, a CVD method as shown in FIG. 3F. Thereafter, the first to fourth metallic wirings 17 to 20 and the first to fifth metallic terminals 12 to 16 are formed on the insulating layer 31 by, for example, a sputtering method and by patterning. The MEMS sensor 1 is obtained through these steps.

In the MEMS sensor 1, when the movable portion 21 of the silicon diaphragm 3 receives pressure (for example, gas pressure) from the first surface 8 side, differential pressure is generated between the inside and the outside of the cavity 7, and, as a result, the movable portion 21 displaces in the thickness direction of the silicon diaphragm 3. Because of this displacement, a silicon crystal forming the piezoresistances R1 to R4 is distorted, and resistance values of the piezoresistances R1 to R4 change.

For example, when a constant electrode bias is being applied to the voltage application terminal (third metallic terminal 14), a voltage between the output terminals (the second and fourth metallic terminals 13 and 15) changes in accordance with a change in each resistance value of the piezoresistances R1 to R4. Therefore, it is possible to detect the magnitude of the pressure generated in the MEMS sensor 1 on the basis of its voltage change.

The MEMS sensor 1 is formed by Si—Si direct junction between the silicon substrate 2 and the silicon diaphragm 3, and therefore an oxide film is not formed therebetween. As a result, it is possible to prevent a gas from entering the cavity 7 through the oxide film even when the MEMS sensor 1 is used in a gaseous environment in which the radius of an atom, such as helium (He) or hydrogen ($H_2$), is small. As a result, it is possible to hold the degree of vacuum of the inside of the cavity 7, and therefore it is possible to prevent the property fluctuation of the MEMS sensor 1.

Additionally, the plane orientation of the first surface 4 of the silicon substrate 2 and the plane orientation of the first surface 4 of the silicon diaphragm 3 differ from each other. This makes it possible to employ a plane orientation in which characteristics of the piezoresistances R1 to R4 become optimal as the plane orientation of the first surface 4 of the silicon diaphragm 3 without being restricted by the plane orientation of the first surface 4 of the silicon substrate 2. More specifically, the plane orientation of the first surface 4 of the silicon substrate 2 is a (100) surface, and the plane orientation of the first surface 4 of the silicon diaphragm 3 is a (110) surface. The fact that the plane orientation of the formation surface of each of the piezoresistances R1 to R4 is preferably the (110) surface rather than the (100) surface can be described by a comparison between FIG. 5A and FIG. 5B.

Figure 5B:
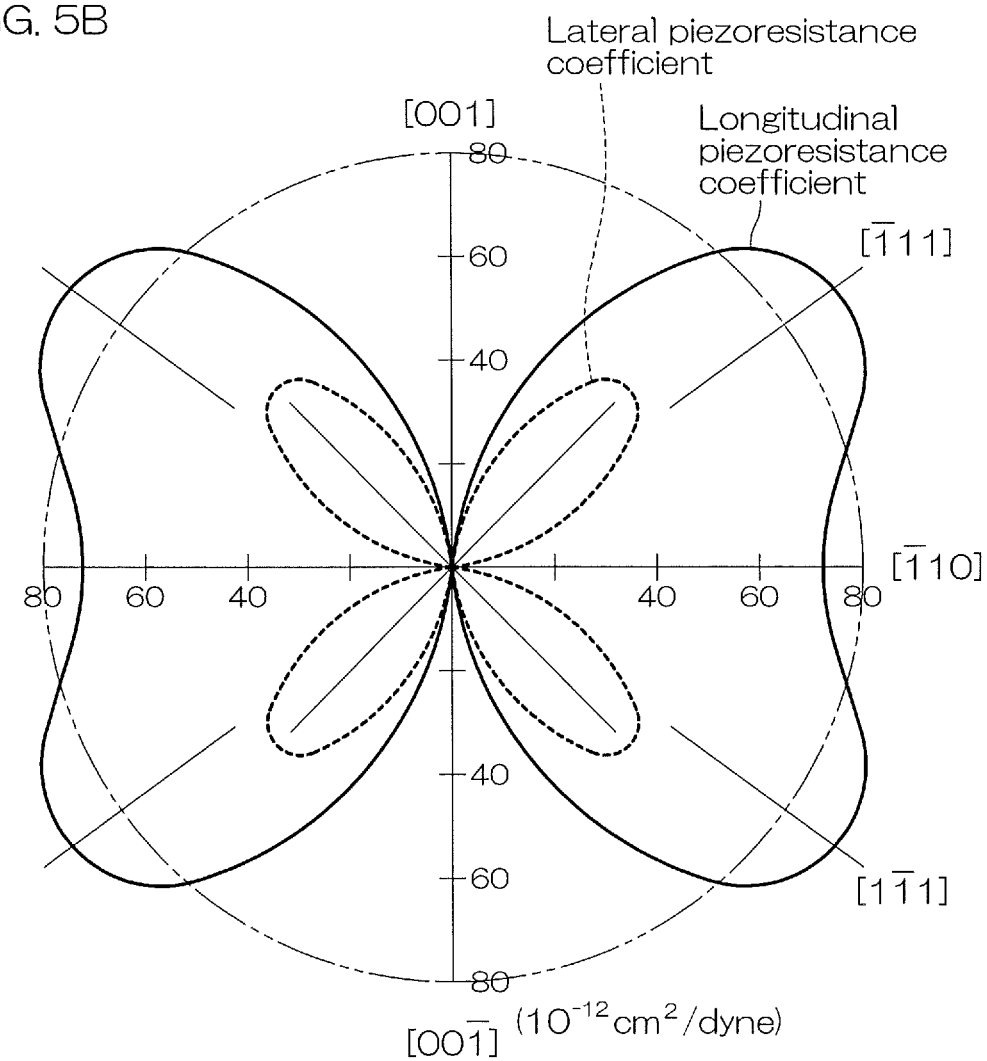
FIG. 5B is a view to describe the piezoresistance coefficient of a piezoresistance formed at a (110) surface.

FIG. 5A is a view to describe the piezoresistance coefficient of a piezoresistance formed at a (100) surface. FIG. 5B is a view to describe the piezoresistance coefficient of a piezoresistance formed at a (110) surface.

When a comparison is made between FIG. 5A and FIG. 5B, the lateral piezoresistance coefficient of FIG. 5B is somewhat smaller than the lateral piezoresistance coefficient of FIG. 5A. Therefore, regarding the lateral piezoresistance coefficient, it is preferable to form the piezoresistances R1 to R4 at the (100) surface rather than the (110) surface. However, when a comparison is made between FIG. 5A and FIG. 5B regarding the longitudinal piezoresistance coefficient, the longitudinal piezoresistance coefficient of FIG. 5B is far greater than the longitudinal piezoresistance coefficient of FIG. 5A. In other words, in consideration of the amount of increase of the longitudinal piezoresistance coefficient, it is preferable, from a comprehensive perspective, to form the piezoresistances R1 to R4 at the (110) surface rather than the (100) surface although the lateral piezoresistance coefficient is somewhat inferior.

Additionally, the longitudinal piezoresistance coefficient and the lateral piezoresistance coefficient become large at a <111> axis in the (110) surface as shown in FIG. 5B, and therefore it is preferable to dispose the piezoresistances R1 to R4 on the <111> axis. In other words, in FIG. 1, it is preferable for each of the piezoresistances R1 to R4 to be formed in a longitudinal shape that extends in the direction of the <111> axis. Hence, it is possible to enlarge the longitudinal piezoresistance coefficient and the lateral piezoresistance coefficient of each of the piezoresistances R1 to R4, and therefore it is possible to improve the sensibility of the piezoresistances R1 to R4.

Additionally, the piezoresistances R1 to R4 are disposed at the sides 7A to 7D of the cavity 7, respectively. Hence, when the silicon diaphragm 3 vibrates, the piezoresistances R1 and R3 disposed at the pair of first and third sides 7A and 7C facing each other of the cavity 7 are pulled in the longitudinal direction, and resistance increases. On the other hand, the piezoresistances R2 and R4 disposed at the pair of second and fourth sides 7B and 7D facing each other of the cavity 7 are pulled in the width direction, and resistance decreases. As a result, it is possible to make a large difference in the resistance value between the piezoresistances R1 and R3 of the first and third sides 7A and 7C and the piezoresistances R2 and R4 of the second and fourth sides 7B and 7D.

Additionally, the cavity 7 is formed not at the silicon diaphragm 3 but at the silicon substrate 2 that is thicker than the silicon diaphragm 3. Therefore, it is possible to form the cavity 7 highly accurately and easily. Additionally, the MEMS sensor 1 is formed by Si—Si direct junction between the silicon substrate 2 and the silicon diaphragm 3. In other words, the substrate and the diaphragm are equal to each other in linear expansion coefficient, and therefore it is possible to restrain the occurrence of stress in the junction interface 10 that results from a temperature change. Consequently, it is possible to stabilize characteristics of the piezoresistances R1 to R4.

Figure 6:
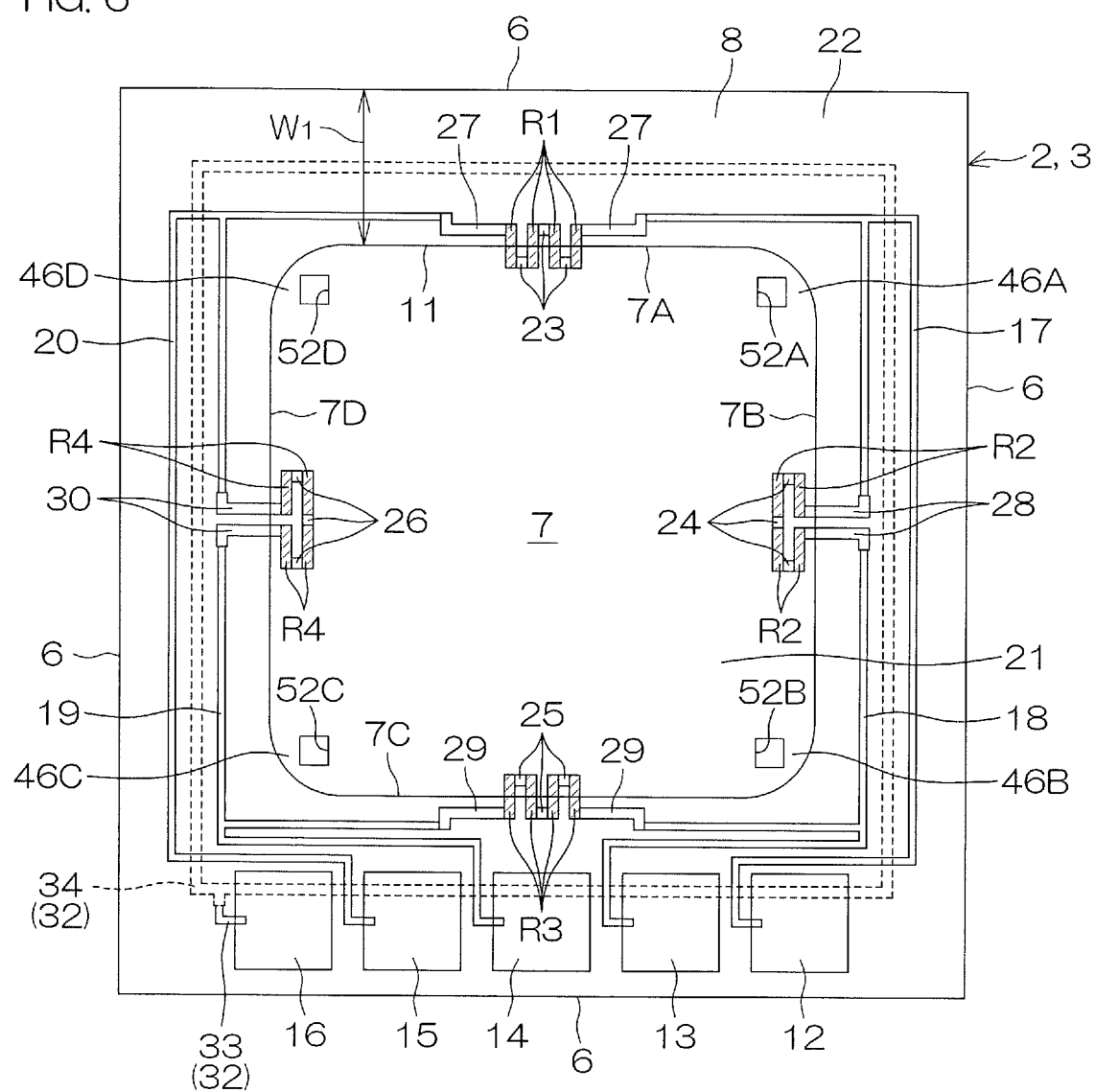
FIG. 6 is a plan view of a MEMS sensor according to a second preferred embodiment of the present invention.
Figure 7:
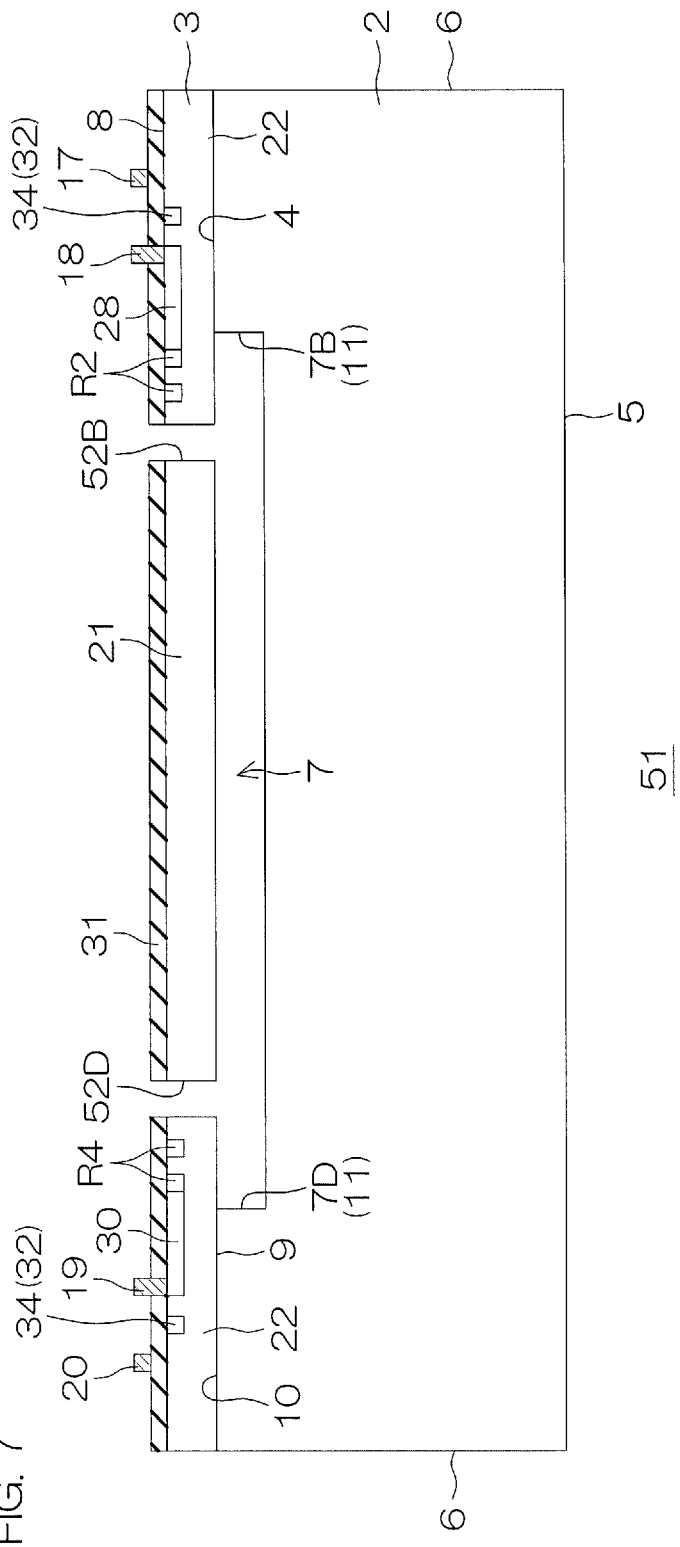
FIG. 7 is a cross-sectional view of the MEMS sensor according to the second preferred embodiment of the present invention.

FIG. 6 is a plan view of a MEMS sensor 51 according to a second preferred embodiment of the present invention. FIG. 7 is a cross-sectional view of the MEMS sensor 51 according to the second preferred embodiment of the present invention. FIG. 7 chiefly shows a characterized part of the MEMS sensor 51 for convenience, and does not show a cross section at a specific location of FIG. 6. Additionally, in the second preferred embodiment, only chief differences distinguished from the first preferred embodiment are described, and the same reference sign is given to a component that is equivalent to each component described above, and a description thereof is omitted.

In the MEMS sensor 51, a plurality of through-holes 52A, 52B, 52C, and 52D are formed in the silicon diaphragm 3. Referring to FIG. 6, the plurality of through-holes 52A, 52B, 52C, and 52D are formed at the first corner portion 46A, the second corner portion 46B, the third corner portion 46C, and the fourth corner portion 46D of the cavity 7, respectively, in a plan view. Hence, the inside and the outside of the cavity 7 lead to each other through the through-holes 52A, 52B, 52C, and 52D. Therefore, in the MEMS sensor 51, the cavity 7 is not sealed by the silicon diaphragm 3 unlike the MEMS sensor 1.

The shape of each of the through-holes 52A, 52B, 52C, and 52D may be, for example, a quadrangular shape in a plan view as shown in FIG. 6, or may be a circular shape in a plan view or a triangular shape in a plan view.

Likewise, in this MEMS sensor 51, the plane orientation of the first surface 4 of the silicon substrate 2 and the plane orientation of the first surface 4 of the silicon diaphragm 3 differ from each other. This makes it possible to employ a plane orientation in which characteristics of the piezoresistances R1 to R4 become optimal as the plane orientation of the first surface 4 of the silicon diaphragm 3 without being restricted by the plane orientation of the first surface 4 of the silicon substrate 2. Consequently, it is possible to stabilize characteristics of the piezoresistances R1 to R4.

Additionally, the through-holes 52A to 52D are formed, and therefore it is possible to exclude the influence of outside pressure.

FIG. 8A to FIG. 8G are views showing part of a process of manufacturing the MEMS sensor 51 according to the second preferred embodiment of the present invention.

In order to manufacture the MEMS sensor 51, the silicon substrate 2 is prepared, and the cavity 7 is formed in the silicon substrate 2, for example, as shown in FIG. 8A. The cavity 7 may be formed by selectively applying dry etching to the first surface 4 of the silicon substrate 2.

On the other hand, the SOI substrate 35 is prepared, and a plurality of through-holes 52A to 52D are formed in the active layer 38 of the SOI substrate 35 as shown in FIG. 8B. The plurality of through-holes 52A to 52D may be formed by allowing the active layer 38 to be selectively subjected to dry etching, for example, until the through-holes 52A to 52D reach the BOX layer 37 from the second surface 42 of the active layer 38. This manner in which the plurality of through-holes 52A to 52D are formed by using the SOI substrate 35 makes it possible to easily adjust the depth of the plurality of the through-holes 52A to 52D on the basis of the thickness of the active layer 38.

Thereafter, the SOI substrate 35 is reversed up and down, and the SOI substrate 35 is bonded onto the silicon substrate 2 so that the second surface 42 of the active layer 38 comes into contact with the first surface 4 of the silicon substrate 2 as shown in FIG. 8C. Thereafter, annealing treatment is performed, for example, at 1000° C. to 1200° C. for 30 minutes to 90 minutes. Hence, the SOI substrate 35 is joined to the silicon substrate 2.

The substrate to be joined to the silicon substrate 2 may be the second silicon substrate 43 as shown in FIG. 4. In this case, it is recommended to form a concave portion, which corresponds to each of the plurality of the through-holes 52A to 52D, at the second silicon substrate 43. This concave portion becomes each of the plurality of the through-holes 52A to 52D by allowing the second surface 45 of the second silicon substrate 43 to reach the bottom portion of the concave portion when the second silicon substrate 43 is thinned.

Thereafter, the support substrate 36 and the BOX layer 37 of the SOI substrate 35 are removed as shown in FIG. 8D. The support substrate 36 and the BOX layer 37 can be removed by, for example, grinding, etching, or the like. Thereafter, the active layer 38 is processed until the active layer 38 attains a desired thickness (thickness of the silicon diaphragm 3). The active layer 38 may be thinned by, for example, grinding, etching, polishing, or the like. If the active layer 38 is pre-formed with a desired thickness at the stage of the SOI substrate 35, the step of thinning the active layer 38 can be omitted after the BOX layer 37 is removed. Hence, the silicon diaphragm 3 made of the active layer 38 is formed.

Thereafter, impurity ions (in the present preferred embodiment, boron (B)) are selectively implanted into the first surface 8 of the silicon diaphragm 3 as shown in FIG. 8E, and annealing treatment is performed. Hence, the piezoresistances R1 to R4 are formed at the silicon diaphragm 3.

Figure 8F:
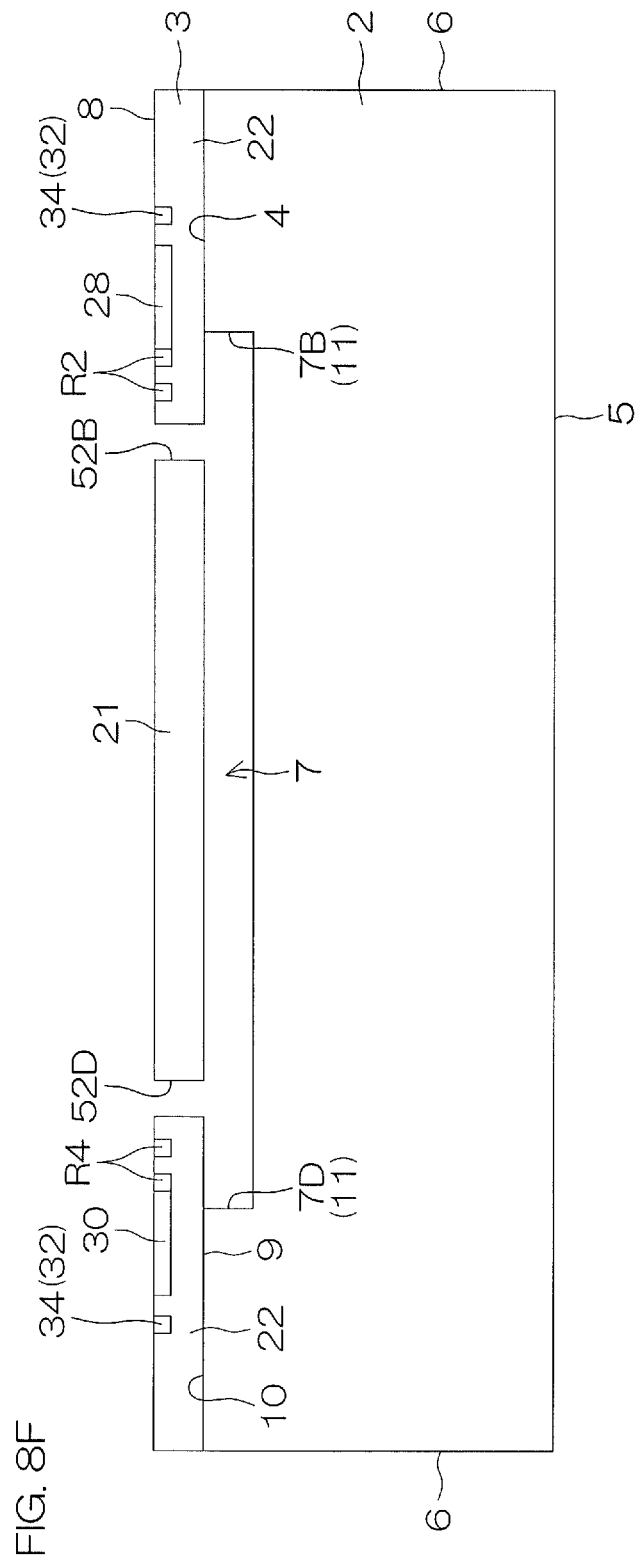

Thereafter, impurity ions (in the present preferred embodiment, boron (B)) are selectively implanted into the first surface 8 of the silicon diaphragm 3 as shown in FIG. 8F, and annealing treatment is performed. Hence, the piezoresistances R1 to R4 are formed at the silicon diaphragm 3. The first to fourth relay wirings 23 to 26, the first to fourth contact wirings 27 to 30, and the diffusion wiring 34 of the fifth wiring 32 are formed.

Figure 8G:
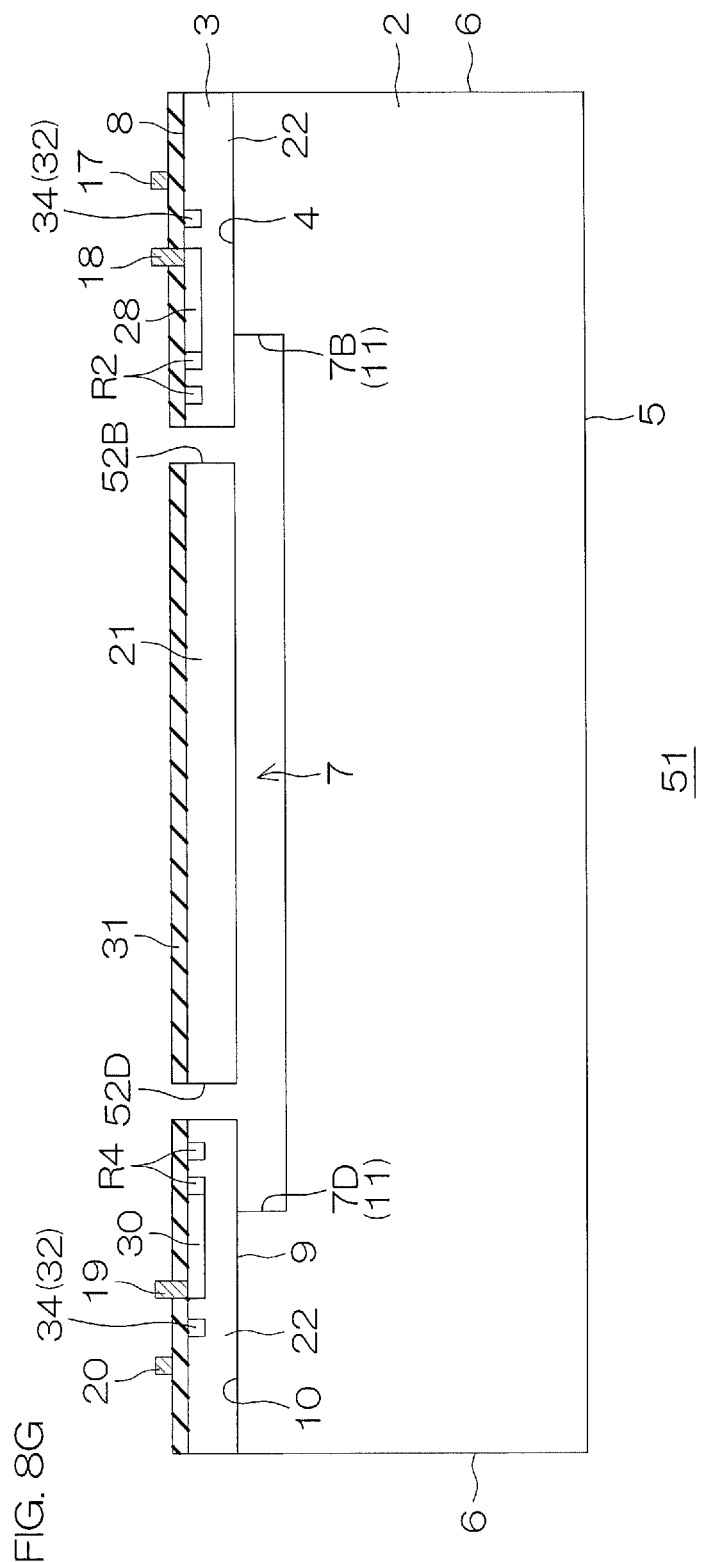

Thereafter, the insulating layer 31 is formed on the silicon diaphragm 3 by, for example, the CVD method as shown in FIG. 8G. Thereafter, the first to fourth metallic wirings 17 to 20 and the first to fifth metallic terminals 12 to 16 are formed on the insulating layer 31 by, for example, the sputtering method and by patterning. The MEMS sensor 51 is obtained through these steps.

Figure 9:
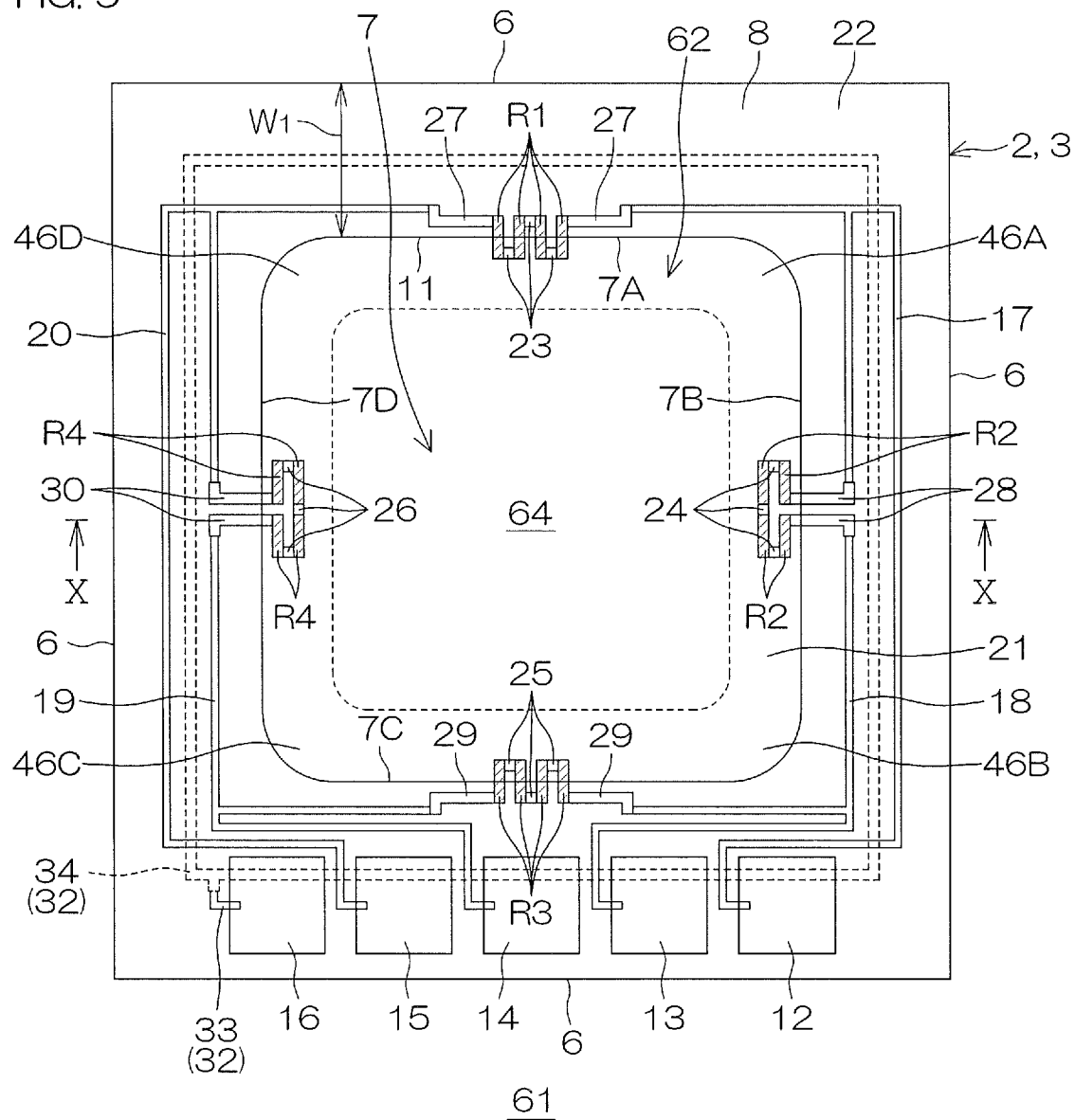
FIG. 9 is a plan view of a MEMS sensor according to a third preferred embodiment of the present invention.
Figure 10:
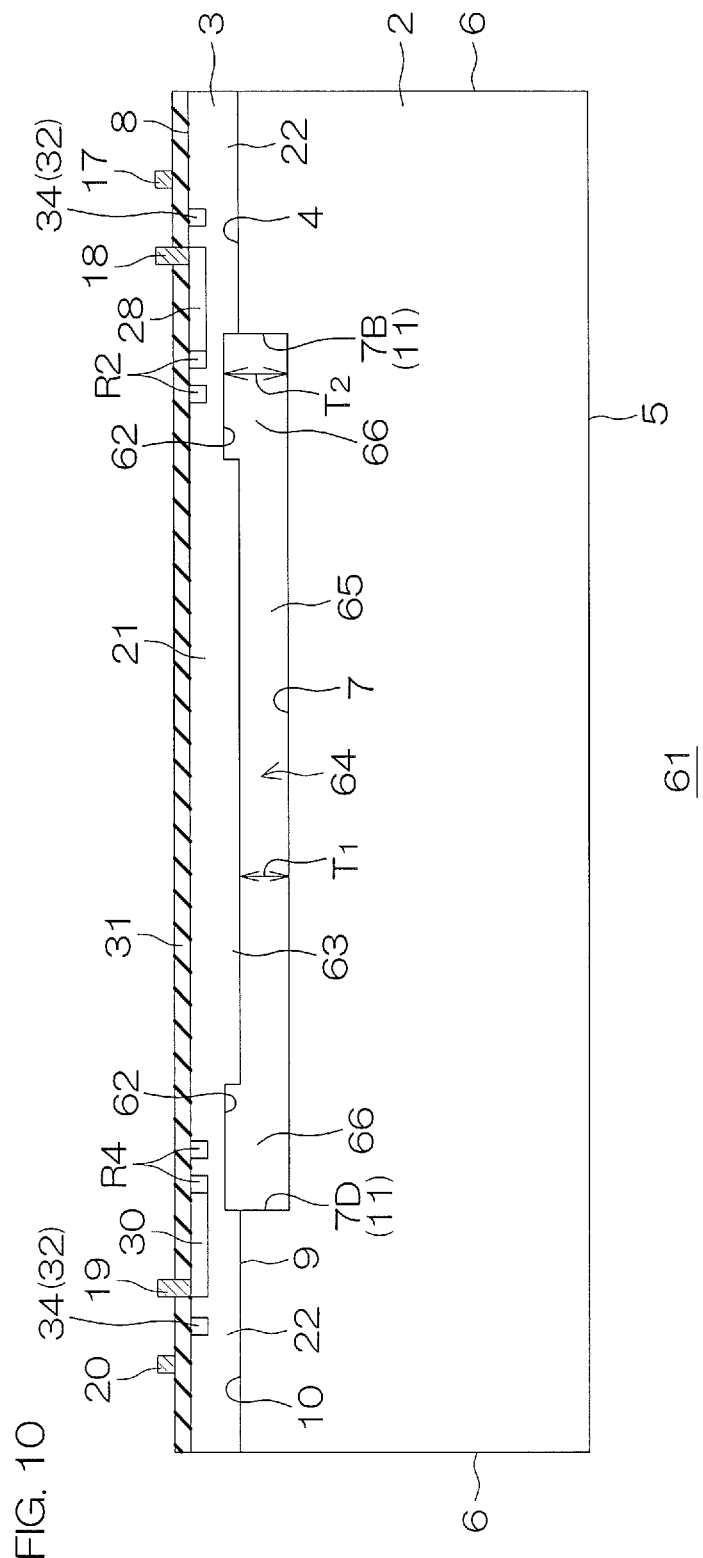
FIG. 10 is across-sectional view of the MEMS sensor according to the third preferred embodiment of the present invention, showing a cross section along line X-X of FIG. 9.

FIG. 9 is a plan view of a MEMS sensor 61 according to a third preferred embodiment of the present invention. FIG. 10 is a cross-sectional view of the MEMS sensor 61 according to the third preferred embodiment of the present invention, showing a cross section along line X-X of FIG. 9. In the third preferred embodiment, only chief differences distinguished from the first preferred embodiment are described, and the same reference sign is given to a component that is equivalent to each component described above, and a description thereof is omitted.

In the MEMS sensor 61, a second cavity 62 is formed at the silicon diaphragm 3. The second cavity 62 is formed at the second surface 9 of the silicon diaphragm 3, and faces the cavity 7.

In the present preferred embodiment, the second cavity 62 is formed annularly along the circumferential edge 11 of the cavity 7 in a plan view. Hence, a convex portion 63 surrounded by the second cavity 62 is formed at the second surface 9 of the silicon diaphragm 3. The second cavity 62 is not necessarily required to be annular, and may be configured so that, for example, the entirety of the movable portion 21 of the silicon diaphragm 3 is concaved. The depth of the second cavity 62 is, for example, 0.1 µm to 25 µm.

In the MEMS sensor 61, a cavity 64, which is formed by combining the cavity 7 and the second cavity 62 together, is formed by the second cavity 62.

The cavity 64 integrally includes a first portion 65 having a first size $T_1$ and a second portion 66 having a second size $T_2$ greater than the first size $T_1$ in the thickness direction of the silicon substrate 2. The first portion 65 is a portion sandwiched between a bottom surface of the cavity 7 and the top of the convex portion 63. The second portion 66 is a portion sandwiched between the bottom surface of the cavity 7 and a bottom surface of the second cavity 62.

Although a lateral surface of the cavity 7 and a lateral surface of the second cavity 62 are flush with each other as shown in FIG. 10 in the present preferred embodiment, these lateral surfaces may deviate from each other. For example, the lateral surface of the second cavity 62 may be placed at a more outward position than the lateral surface of the cavity 7.

Likewise, in this MEMS sensor 61, the plane orientation of the first surface 4 of the silicon substrate 2 and the plane orientation of the first surface 4 of the silicon diaphragm 3 differ from each other. This makes it possible to employ a plane orientation in which characteristics of the piezoresistances R1 to R4 become optimal as the plane orientation of the first surface 4 of the silicon diaphragm 3 without being restricted by the plane orientation of the first surface 4 of the silicon substrate 2. Consequently, it is possible to stabilize characteristics of the piezoresistances R1 to R4.

Additionally, the formation of the second cavity 62 makes it possible to raise the sensibility, and it is possible to prevent a breakdown by setting the size of $T_1$ at such a size as to come into contact with the bottom portion of the cavity 7 until the silicon diaphragm 3 is dented and broken because of a raised external pressure.

FIG. 11A to FIG. 11G are views showing part of a process of manufacturing the MEMS sensor 61 according to the third preferred embodiment of the present invention.

In order to manufacture the MEMS sensor 61, the silicon substrate 2 is prepared, and the cavity 7 is formed in the silicon substrate 2, for example, as shown in FIG. 11A. The cavity 7 may be formed by selectively applying dry etching to the first surface 4 of the silicon substrate 2.

On the other hand, the SOI substrate 35 is prepared, and the second cavity 62 is formed in the active layer 38 of the SOI substrate 35 as shown in FIG. 11B. The second cavity 62 may be formed by allowing the active layer 38 to be selectively subjected to dry etching, for example, from the second surface 42 of the active layer 38 up to a halfway position in the thickness direction of the active layer 38.

Thereafter, the SOI substrate 35 is reversed up and down, and the SOI substrate 35 is bonded onto the silicon substrate 2 so that the second surface 42 of the active layer 38 comes into contact with the first surface 4 of the silicon substrate 2 as shown in FIG. 11C. Thereafter, annealing treatment is performed, for example, at 1000° C. to 1200° C. for 30 minutes to 90 minutes. Hence, the SOI substrate 35 is joined to the silicon substrate 2.

The substrate to be joined to the silicon substrate 2 may be the second silicon substrate 43 as shown in FIG. 4. In this case, it is recommended to form the second cavity 62 at the first surface 44 of the second silicon substrate 43.

Figure 11D:
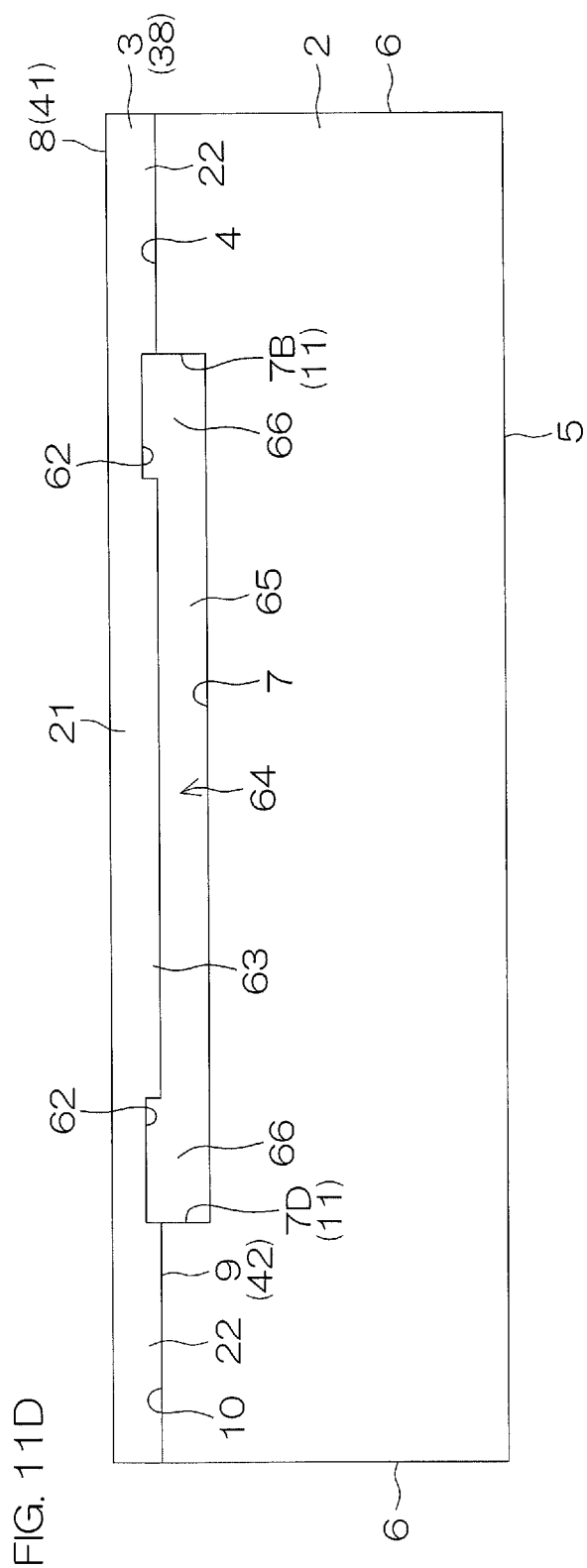

Thereafter, the support substrate 36 and the BOX layer 37 of the SOI substrate 35 are removed as shown in FIG. 11D. The support substrate 36 and the BOX layer 37 can be removed by, for example, grinding, etching, or the like. Thereafter, the active layer 38 is processed until the active layer 38 attains a desired thickness (thickness of the silicon diaphragm 3). The active layer 38 may be thinned by, for example, grinding, etching, polishing, or the like. If the active layer 38 is pre-formed with a desired thickness at the stage of the SOI substrate 35, the step of thinning the active layer 38 can be omitted after the BOX layer 37 is removed. Hence, the silicon diaphragm 3 made of the active layer 38 is formed.

Thereafter, impurity ions (in the present preferred embodiment, boron (B)) are selectively implanted into the first surface 8 of the silicon diaphragm 3 as shown in FIG. 11E, and annealing treatment is performed. Hence, the piezoresistances R1 to R4 are formed at the silicon diaphragm 3.

Figure 11F:
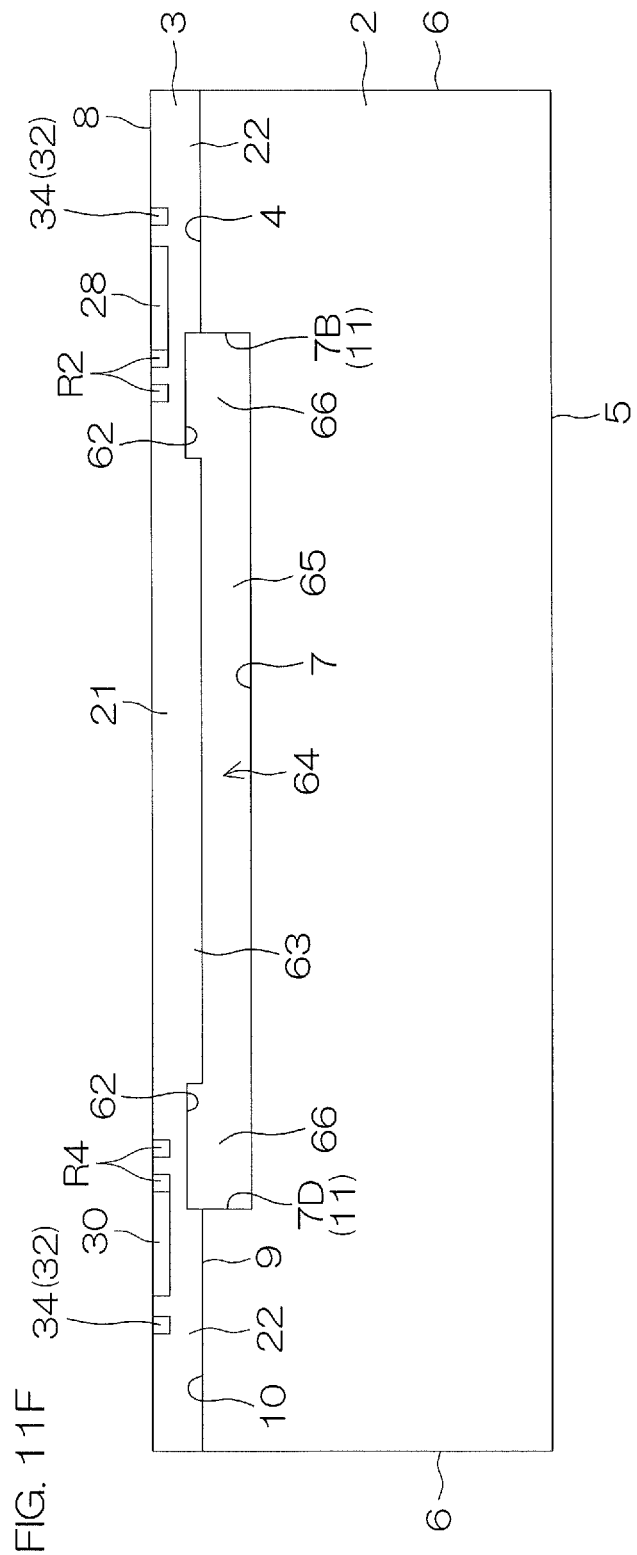

Thereafter, impurity ions (in the present preferred embodiment, boron (B)) are selectively implanted into the first surface 8 of the silicon diaphragm 3 as shown in FIG. 11F, and annealing treatment is performed. Hence, the piezoresistances R1 to R4 are formed at the silicon diaphragm 3. The first to fourth relay wirings 23 to 26, the first to fourth contact wirings 27 to 30, and the diffusion wiring 34 of the fifth wiring 32 are formed.

Thereafter, the insulating layer 31 is formed on the silicon diaphragm 3 by, for example, the CVD method as shown in FIG. 11G. Thereafter, the first to fourth metallic wirings 17 to 20 and the first to fifth metallic terminals 12 to 16 are formed on the insulating layer 31 by, for example, the sputtering method and by patterning. The MEMS sensor 61 is obtained through these steps.

Although the preferred embodiments of the present invention have been described above, the present invention can be carried out in other preferred embodiments.

For example, various design changes may be made within the scope of the matters described in the claims.

EXAMPLES

Next, the present invention will be described on the basis of examples, and yet the present invention is not limited by the following examples.

In the examples, it was verified how much a gas having a small atomic radius can be prevented from entering the inside of the cavity 7 by means of Si—Si direct junction between the silicon substrate 2 and the silicon diaphragm 3. Specifically, that was verified by use of MEMS sensors having Structure 1 to Structure 3 shown in FIG. 12A to FIG. 12C, respectively.

Structure 1 includes a silicon substrate 71 having a through-hole 72, a glass substrate 73, and a silicon membrane 74. The glass substrate 73 is joined to a rear surface of the silicon substrate 71. The silicon membrane 74 is joined to a front surface of the silicon substrate 71 through a silicon oxide ($SiO_2$) film 75. Hence, the through-hole 72 of the silicon substrate 71 is sealed with the glass substrate 73 and the silicon membrane 74.

Structure 2 includes a silicon substrate 76 having a cavity 77 and a silicon membrane 78. The cavity 77 is formed on the front surface side of the silicon substrate 76, and has a bottom portion at a halfway position in the thickness direction of the silicon substrate 76. The silicon membrane 78 is joined to a front surface of the silicon substrate 76 through a silicon oxide ($SiO_2$) film 79. Hence, the cavity 77 of the silicon substrate 76 is sealed with the silicon membrane 78.

Structure 3 is a structure formed in imitation of the first preferred embodiment described above. That is, Structure 3 includes a silicon substrate 80 having a cavity 81 and a silicon membrane 82. The cavity 81 is formed on the front surface side of the silicon substrate 80, and has a bottom portion at a halfway position in the thickness direction of the silicon substrate 80. The silicon membrane 82 is joined directly to a front surface of the silicon substrate 80. Therefore, a junction interface of Si—Si junction is formed between the silicon substrate 80 and the silicon membrane 82. Additionally, the front surface of the silicon substrate 80 (joint surface with the silicon membrane 82) is a (100) surface, and the front surface of the silicon membrane 82 (surface on the side opposite to a joint surface with the silicon substrate 80) is a (110) surface.

In any of Structures 1 to 3, the inside of each of the cavities 77 and 81 (through-hole 72) of the MEMS sensors is kept in a vacuum state in an initial state.

Figure 13:
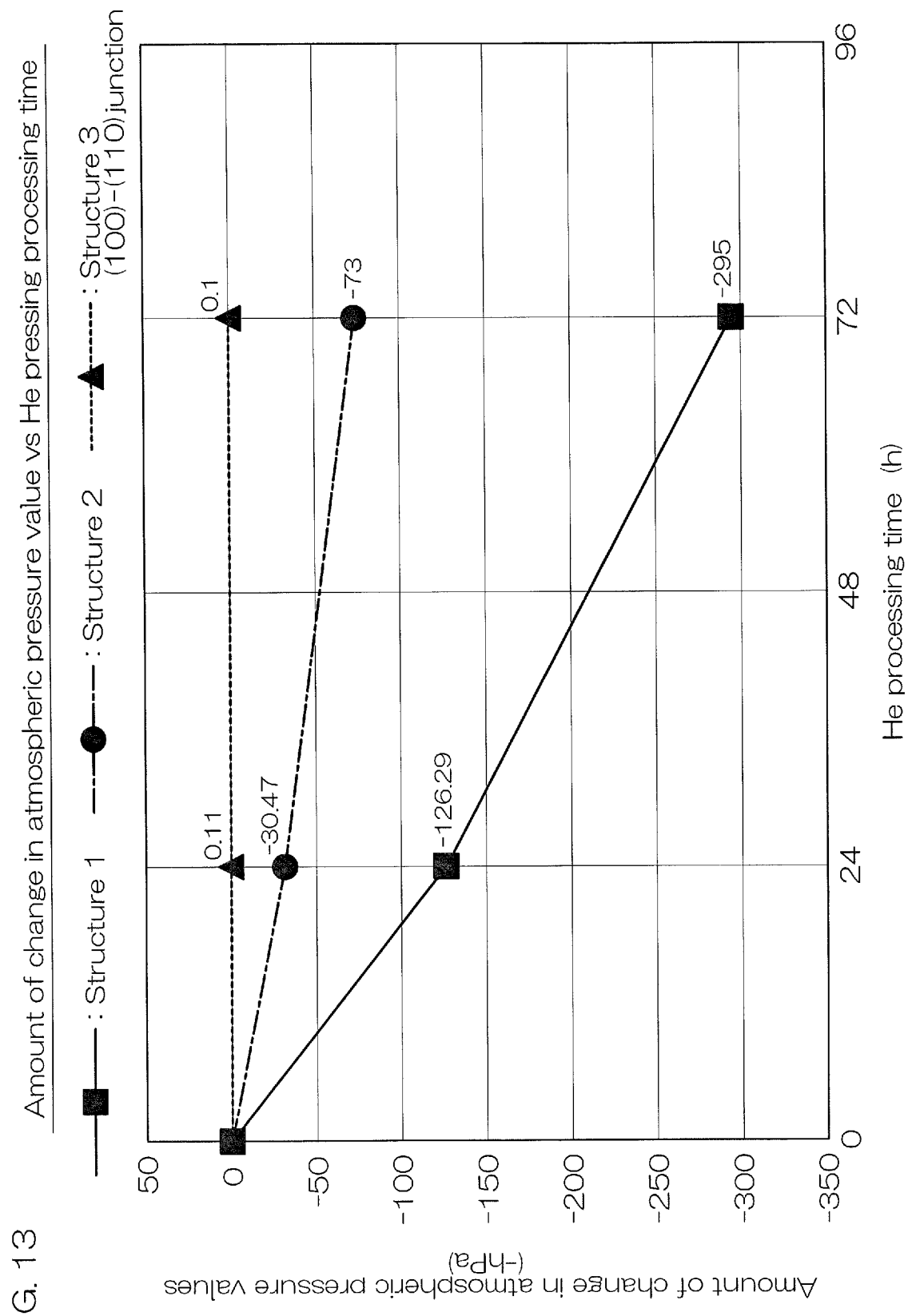
FIG. 13 is a view showing a relationship between He processing time and the amount of change in atmospheric pressure value of the structures 1 to 3.

FIG. 13 shows results obtained by measuring the amount of change in pressure of the inside of each of the cavities 77 and 81 (through-hole 72) of the MEMS sensors when the MEMS sensors of Structures 1 to 3 are stored in a He atmosphere of about 2.5 atmospheric pressure and when 0 h (initial value), 24 h, and 72 h elapse.

In Structures 1 and 2, the silicon oxide films 75 and 79 are interposed between the silicon substrates 71 and and the silicon membranes 74 and 78, respectively. Therefore, He (helium) penetrates the silicon oxide films 75 and 79, and enters the inside of the cavity 77 (through-hole 72), and pressure of the inside of the cavity 77 (through-hole 72) varies in proportion to the length during which the MEMS sensor is stored in the He atmosphere as shown in FIG. 13. As a result, the degree of vacuum of the cavity 77 (through-hole 72) is reduced, and the dented amount of each of the silicon membranes 74 and 78 changes, and hence there is a concern that the property fluctuation of the MEMS sensor will be caused.

On the other hand, in Structure 3, the junction between the silicon substrate 80 and the silicon membrane 82 is Si—Si direct junction. Therefore, pressure fluctuations hardly occurred after the MEMS sensor was stored in the He atmosphere for a long time as shown in FIG. 13. Therefore, it has been found that it is possible to prevent a gas from entering the cavity through the oxide film even when the MEMS sensor of Structure 1 is used under a gaseous environment having a small atomic radius, such as helium (He) or hydrogen ($H_2$). Additionally, based on Structure 3, it has been shown that it is possible to achieve the above-described effect even when the plane orientation of the front surface (the first surface 4 described above) of the silicon substrate 80 and the plane orientation of the front surface (the first surface 8 described above) of the silicon membrane 82 differ from each other.

What is claimed is:

1. A MEMS sensor comprising:
a silicon substrate that has a first surface and a second surface on a side opposite to the first surface and that has a cavity in the first surface;
a silicon diaphragm that has a first surface and a second surface on a side opposite to the first surface of the silicon diaphragm and in which the second surface of the silicon diaphragm is joined directly to the first surface of the silicon substrate; and
a piezoresistance formed at the first surface of the silicon diaphragm,
wherein a plane orientation of the first surface of the silicon substrate and a plane orientation of the first surface of the silicon diaphragm differ from each other.

2. The MEMS sensor according to claim 1, wherein the plane orientation of the first surface of the silicon substrate is a (100) surface, and the plane orientation of the first surface of the silicon diaphragm is a (110) surface.

3. The MEMS sensor according to claim 2, wherein the piezoresistance is formed in a longitudinal shape that extends in a direction of a <111> axis.

4. The MEMS sensor according to claim 2, wherein the cavity is formed in a quadrangular shape in a plan view, and
the piezoresistance includes a plurality of piezoresistances disposed at each side of the cavity in a plan view, and
the plurality of piezoresistances are each formed in a longitudinal shape that extends in the direction of the <111> axis.

5. The MEMS sensor according to claim 4, wherein the plurality of piezoresistances include a first piezoresistance, a second piezoresistance, a third piezoresistance, and a fourth piezoresistance, and
the MEMS sensor includes a wiring that is electrically connected to the first to fourth piezoresistances and that forms a bridge circuit including the first to fourth piezoresistances.

6. The MEMS sensor according to claim 1, wherein the silicon diaphragm has a predetermined thickness.

7. The MEMS sensor according to claim 6, wherein the silicon diaphragm has a thickness of 3 µm to 30 µm.

8. The MEMS sensor according to claim 6, wherein the cavity is sealed with the silicon diaphragm.

9. The MEMS sensor according to claim 1, wherein the silicon diaphragm has a through-hole that leads to the cavity.

10. The MEMS sensor according to claim 1, wherein the cavity is formed in a quadrangular shape in a plan view, and
the silicon diaphragm has a plurality of through-holes that lead to the cavity, each of plurality of through-holes being formed at each corner portion of the cavity in a plan view.

11. The MEMS sensor according to claim 1, wherein the silicon diaphragm has a second cavity that faces the cavity, the second cavity being formed at the second surface of the silicon diaphragm.

12. The MEMS sensor according to claim 11, wherein the second cavity is formed annularly along a circumferential edge of the cavity in a plan view.

13. The MEMS sensor according to claim 11, wherein the cavity is sealed with the silicon diaphragm.

14. The MEMS sensor according to claim 1, wherein a width of a junction interface between the silicon substrate and the silicon diaphragm that is defined by a distance from the circumferential edge of the cavity to an end surface of the silicon substrate in a plan view is 50 µm to 500 µm.

* * * * *